US009685317B2

(12) United States Patent
Yuasa et al.

(10) Patent No.: US 9,685,317 B2
(45) Date of Patent: Jun. 20, 2017

(54) METHOD OF MANUFACTURING SEMICONDUCTOR DEVICE, METHOD OF PROCESSING SUBSTRATE, SUBSTRATE PROCESSING APPARATUS, AND RECORDING MEDIUM

(71) Applicant: HITACHI KOKUSAI ELECTRIC INC., Tokyo (JP)

(72) Inventors: Kazuhiro Yuasa, Toyama (JP); Naonori Akae, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 13/838,209

(22) Filed: Mar. 15, 2013

(65) Prior Publication Data
US 2013/0252434 A1 Sep. 26, 2013

(30) Foreign Application Priority Data

Mar. 22, 2012 (JP) .................................. 2012-66432
Jan. 21, 2013 (JP) .................................. 2013-8833

(51) Int. Cl.
H01L 21/02 (2006.01)
C23C 16/44 (2006.01)

(52) U.S. Cl.
CPC .... *H01L 21/02104* (2013.01); *C23C 16/4404* (2013.01); *H01L 21/0228* (2013.01); *H01L 21/02164* (2013.01); *H01L 21/02211* (2013.01)

(58) Field of Classification Search
None
See application file for complete search history.

(56) References Cited

U.S. PATENT DOCUMENTS

2001/0013607 A1* 8/2001 Miyasaka ........................ 257/66
2003/0073293 A1* 4/2003 Ferro ................... C23C 16/4405
438/478

(Continued)

FOREIGN PATENT DOCUMENTS

JP 05-198520 A 8/1993
JP 2010-219308 A 9/2010

(Continued)

OTHER PUBLICATIONS

Japanese Office Action issued on Nov. 1, 2016 in the Japanese Application No. 2013-008833.

*Primary Examiner* — Joseph Miller, Jr.
(74) *Attorney, Agent, or Firm* — Volpe and Koenig, P.C.

(57) ABSTRACT

A method of manufacturing a semiconductor device includes carrying a substrate into a process container, forming a thin film on the substrate by supplying a source gas into the process container with the substrate accommodated therein, performing a first modification treatment to a byproduct adhered to an inside of the process container by supplying an oxygen-containing gas and a hydrogen-containing gas into the heated process container under a pressure less than an atmospheric pressure, while accommodating the thin film-formed substrate in the process container, carrying the thin film-formed substrate out of the process container, and performing a second modification treatment to the byproduct adhered to the inside of the process container after the first modification treatment by supplying an oxygen-containing gas and a hydrogen-containing gas into the heated process container under the pressure less than the atmospheric pressure, while not accommodating the substrate in the process container.

13 Claims, 17 Drawing Sheets

(56) References Cited

U.S. PATENT DOCUMENTS

| | | | |
|---|---|---|---|
| 2003/0124873 A1* | 7/2003 | Xing | C23C 16/402 438/770 |
| 2004/0144320 A1* | 7/2004 | Hasebe | B08B 7/00 118/724 |
| 2004/0235295 A1* | 11/2004 | Dong et al. | 438/680 |
| 2005/0079699 A1* | 4/2005 | Suzuki | C23C 8/16 438/608 |
| 2006/0040066 A1* | 2/2006 | Tsutae | B08B 7/0035 427/569 |
| 2006/0166452 A1* | 7/2006 | Rao et al. | 438/369 |
| 2006/0281337 A1* | 12/2006 | Matsuura | 438/787 |
| 2008/0093023 A1* | 4/2008 | Tomita | C23C 16/4405 156/345.26 |
| 2008/0317975 A1* | 12/2008 | Furui | H01J 37/32862 427/575 |
| 2010/0209595 A1* | 8/2010 | Kwon | C23C 16/40 427/79 |
| 2011/0059600 A1 | 3/2011 | Sakai et al. | |
| 2011/0130011 A1* | 6/2011 | Sasajima | C23C 16/402 438/770 |
| 2011/0318937 A1* | 12/2011 | Akae | C23C 16/4405 438/758 |

FOREIGN PATENT DOCUMENTS

| | | |
|---|---|---|
| JP | 2011-68984 A | 4/2011 |
| JP | 2011-129877 A | 6/2011 |
| TW | 1355029 B | 3/1997 |

\* cited by examiner

METHOD OF MANUFACTURING SEMICONDUCTOR DEVICE, METHOD OF PROCESSING SUBSTRATE, SUBSTRATE PROCESSING APPARATUS, AND RECORDING MEDIUM

CROSS-REFERENCE TO RELATED APPLICATIONS

This application is based upon and claims the benefit of priority from Japanese Patent Application Nos. 2012-66432, filed on Mar. 22, 2012, and 2013-8833, filed on Jan. 21, 2013, the entire contents of which are incorporated herein by reference.

TECHNICAL FIELD

The present disclosure relates to a method of manufacturing a semiconductor device, a method of processing a substrate, a substrate processing apparatus, and a recording medium.

BACKGROUND

For example, a process of manufacturing a semiconductor device such as a dynamic random access memory (DRAM) includes a substrate processing process that supplies a source gas containing a certain element and a halogen element into a process container with a substrate accommodated therein, thereby forming a thin film, such as an oxide film, on the substrate.

SUMMARY

However, when the above-described substrate processing process is performed, some of the source gas may be adsorbed (or adhered) onto an inner wall, etc. of the process container. The source gas adsorbed onto the inner wall, etc. of the process container may react with the water ($H_2O$) in the air (atmosphere) that penetrates into the process container when the substrate is unloaded, and thus may be changed to a reaction byproduct (hereinafter referred to as a byproduct) containing a halogen element. A film which is formed by the deposition of the reaction byproduct containing the halogen element is easily exfoliated because of relative vulnerability causing the production of particles (foreign materials). If the foreign materials are adhered to the substrate, the quality of the semiconductor device can be degraded, causing a reduction in a yield rate.

The present disclosure provides some embodiments of a method of manufacturing a semiconductor device, a method of processing a substrate, a substrate processing apparatus, and a recording medium, which can suppress the generation of foreign materials in a process container.

According to one embodiment of the present disclosure, a method of manufacturing a semiconductor device includes: carrying a substrate into a process container; forming a thin film on the substrate by supplying a source gas containing a certain element and a halogen element into the process container with the substrate accommodated therein; performing a first modification treatment to a byproduct adhered to an inside of the process container by supplying an oxygen-containing gas and a hydrogen-containing gas into the heated process container under a pressure less than an atmospheric pressure, in the state of accommodating the thin film-formed substrate in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, in the state of not accommodating the substrate in the process container.

According to another embodiment of the present disclosure, provided is a method of processing a substrate which includes: carrying a substrate into a process container; forming a thin film on the substrate by supplying a source gas containing a certain element and a halogen element into the process container with the substrate accommodated therein; performing a first modification treatment to a byproduct adhered to an inside of the process container by supplying an oxygen-containing gas and a hydrogen-containing gas into the heated process container under a pressure less than an atmospheric pressure, in the state of accommodating the thin film-formed substrate in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, in the state of not accommodating the substrate in the process container.

According to another embodiment of the present disclosure, provided is a substrate processing apparatus which includes: a process container configured to accommodate a substrate; a transfer unit configured to carry the substrate into and out of the process container; a source gas supply system configured to supply a source gas containing a certain element and a halogen element into the process container; an oxygen-containing gas supply system configured to supply an oxygen-containing gas into the process container; a hydrogen-containing gas supply system configured to supply a hydrogen-containing gas into the process container; a heater configured to heat an inside the process container; a pressure regulator configured to regulate a pressure inside the process container; and a controller configured to control the transfer unit, the source gas supply system, the oxygen-containing gas supply system, the hydrogen-containing gas supply system, the heater, and the pressure regulator so as to carry the substrate into the process container, supply the source gas into the process container with the substrate accommodated therein to form a thin film on the substrate, supply an oxygen-containing gas and a hydrogen-containing gas into the heated process container under a pressure less than an atmospheric pressure to perform a first modification treatment to a byproduct adhered to an inside of the process container in the state of accommodating the thin film-formed substrate in the process container, carry the thin film-formed substrate out of the process container, and supply an oxygen-containing gas and a hydrogen-containing gas into the heated process container under the pressure less than the atmospheric pressure to perform a second modification treatment to the byproduct adhered to the inside of the process container after the first modification treatment, in the state of not accommodating the substrate in the process container.

According to another embodiment of the present disclosure, provided is a non-transitory computer-readable recording medium storing a program that causes a computer to perform processes of: carrying a substrate into a process container of a substrate processing apparatus; forming a thin film on the substrate by supplying a source gas containing a certain element and a halogen element into the process container with the substrate accommodated therein; performing a first modification treatment to a byproduct adhered to an inside of the process container by supplying an oxygen-containing gas and a hydrogen-containing gas into the heated process container under a pressure less than an atmospheric pressure, in the state of accommodating the thin film-formed substrate in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, in the state of not accommodating the substrate in the process container.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

First Embodiment of Present Disclosure

Hereinafter, a first embodiment of the present disclosure will be described in detail with reference to the drawings.

Reference will now be made in detail to various embodiments, examples of which are illustrated in the accompanying drawings. In the following detailed description, numerous specific details are set forth in order to provide a thorough understanding of the inventive aspects of this disclosure. However, it will be apparent to one of ordinary skill in the art that the inventive aspect of this disclosure may be practiced without these specific details. In other instances, well-known methods, procedures, systems, and components have not been described in detail so as not to unnecessarily obscure aspects of the various embodiments.

(1) Configuration of Substrate Processing Apparatus

Figure 1:
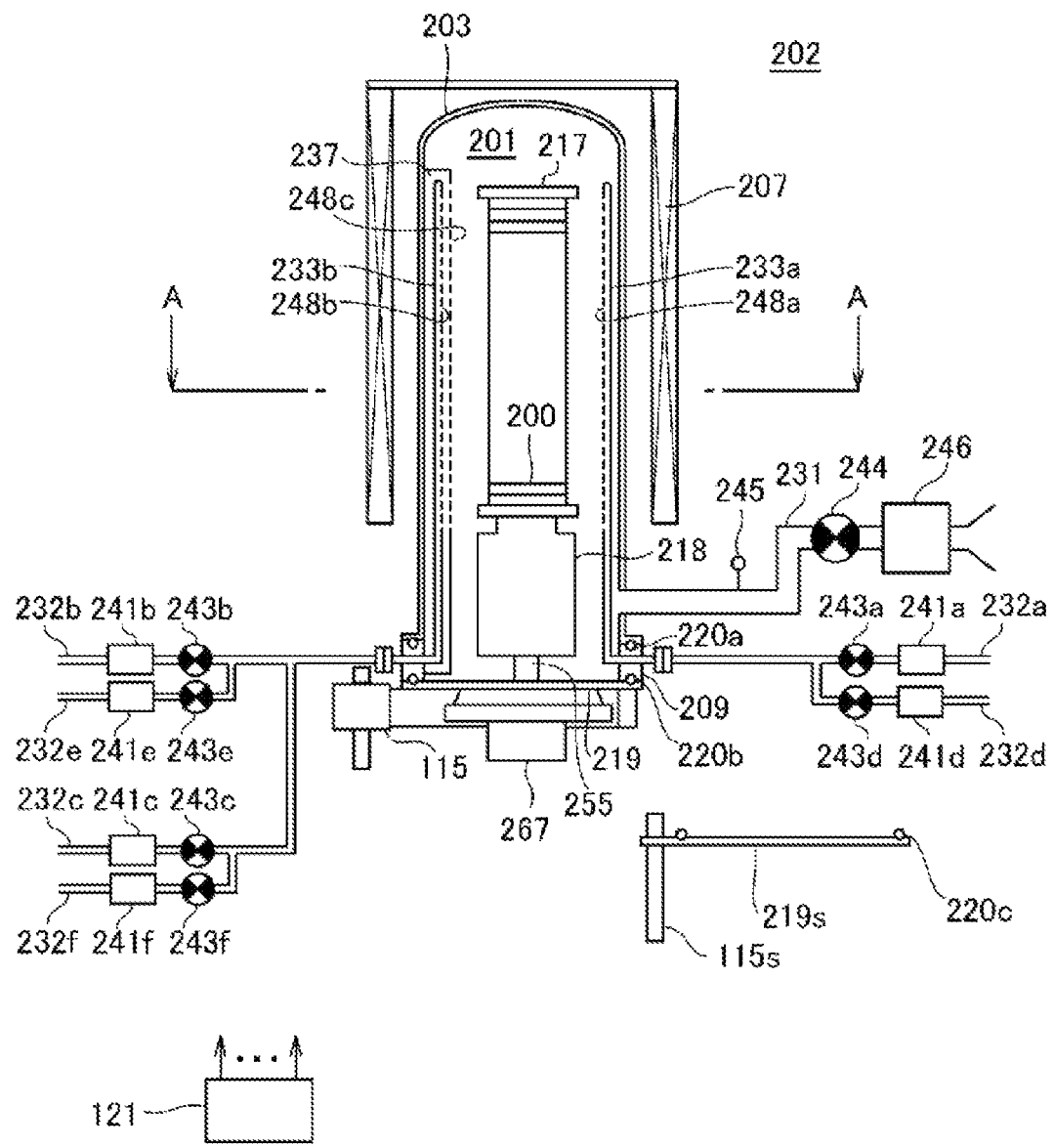
FIG. 1 is a view schematically illustrating a configuration of a vertical processing furnace of a substrate processing apparatus, according to some embodiments, which is appropriately used in an embodiment of the present disclosure, and is a vertical sectional view of a processing furnace.
Figure 2:
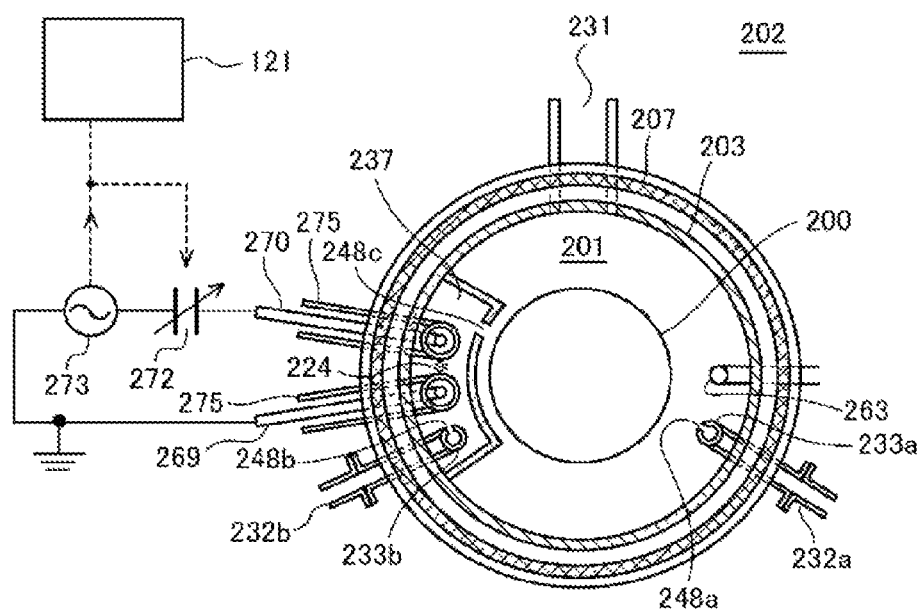
FIG. 2 is a view schematically illustrating a configuration of the vertical processing furnace of the substrate processing apparatus, according to some embodiments, which is appropriately used in an embodiment of the present disclosure, and is a sectional view taken along line A-A of FIG. 1 for the processing furnace.

FIG. 1 is a view schematically illustrating a configuration of a vertical processing furnace of a substrate processing apparatus which is appropriately used in an embodiment of the present disclosure, according to some embodiments, and is a vertical sectional view of a processing furnace 202 portion. FIG. 2 is a view schematically illustrating a configuration of the vertical processing furnace of the substrate processing apparatus, according to some embodiments, which is appropriately used in an embodiment of the present disclosure, and is a sectional view taken along line A-A of FIG. 1 for the processing furnace 202 portion.

As illustrated in FIG. 1, the processing furnace includes a heater 207 as a heating means (heating unit). The heater 207 has a cylindrical shape, and is vertically fixed and disposed by the support of a heater base (not shown) that is a support plate. Also, as described later, the heater 207 may act as an activation unit (excitation part) that activates (excites) a gas with heat.

The reaction pipe 203 are concentrically paired with the heater 207, and disposed inside the heater 207. The reaction tube 203, for example, may be formed of a heat-resistant material such as quartz ($SiO_2$) or silicon carbide (SiC), and formed in a cylindrical shape in which an upper end of the reaction tube 203 is closed and a lower end of the reaction tube 203 is opened. A manifold (inlet flange) 209 is concentrically paired with the reaction tube 203, and disposed under the reaction tube 203. The manifold 209, for example, may be formed of metal such as stainless, and formed in a cylindrical shape in which an upper end and a lower end of the manifold 209 are opened. The upper end of the manifold 209 is caught and coupled to the lower end of the reaction tube 203, and configured to support the reaction tube 203. Also, an O ring 220a is disposed as a seal member between the manifold 209 and the reaction tube 203. The manifold 209 is supported by the heater base, and thus, the reaction tube 203 is vertically fixed and disposed. Generally, the process container (reaction vessel) is configured by the reaction tube 203 and the manifold 209. A processing chamber 201 is disposed in a cylindrical hollow portion of a process container. The processing chamber 201 may accommodate a wafer 200 (which is a substrate) that is vertically aligned in a horizontal posture and in multiple stages by a later-described boat 217.

A first nozzle 233a as a first gas introduction part and a second nozzle 233b as a second gas introduction part are disposed to penetrate a side wall of the manifold 209, in the processing chamber 201. A first gas supply pipe 232a is connected to the first nozzle 233a. Also, a second gas supply pipe 232b and a third gas supply pipe 232c are connected to the second nozzle 233b. In this way, the two nozzles 233a and 233b and the three gas supply pipes 232a to 232c are disposed in the reaction tube 203, and a plurality of kinds of gases, herein, three kinds of gases may be supplied into the processing chamber 201.

In the first gas supply pipe 232a, a mass flow controller (MFC) 241a that is a flow rate controller (flow rate control unit) and a valve 243a that is an opening/closing valve are disposed sequentially from an upstream direction. Also, a first inert gas supply pipe 232d is connected to a downstream side lower in position than the valve 243a of the first gas supply pipe 232a. In the first inert gas supply pipe 232d, a mass flow controller 241d that is a flow rate controller (flow rate control unit) and a valve 243d that is an opening/closing valve are disposed sequentially from an upstream side. Furthermore, the above-described first nozzle 233a is connected to a front end portion of the first gas supply pipe 232a. In an arc-shaped space between an inner wall of the reaction tube 203 and the wafer 200, the first nozzle 233a is disposed to ascend toward an upper portion of a stack direction of a plurality of the wafers 200, along an upper portion from a lower portion of an inner wall of the reaction tube 203. That is, the first nozzle 233a is disposed along a wafer arrangement area, in an area that horizontally surrounds the wafer arrangement area, at a side of the wafer arrangement area in which the wafers 200 are arranged. The first nozzle 233a is configured with a L-shaped long nozzle, a horizontal portion of the first nozzle 233a is disposed to penetrate a side wall of the manifold 209, and a vertical portion of the first nozzle 233a is disposed to at least ascend in a direction from one side end to the other side end of the wafer arrangement area. A gas supply hole 248a for supplying a gas is disposed at a side surface of the first nozzle 233a. The gas supply hole 248a is opened to orient to the center of the reaction tube 203, thereby enabling the supply of a gas toward the wafer 200. The gas supply hole 248a is disposed in plurality over from a lower portion to an upper portion of the reaction tube 203. The plurality of gas supply holes 248a have the same opening area, and are disposed at the same opening pitch.

In some embodiments, a first gas supply system is configured by the first gas supply pipe 232a, the mass flow controller 241a, and the valve 243a. Also, it may be considered that the first nozzle 233a is included in the first gas supply system. Also, a first inert gas supply system may be mainly configured by the first inert gas supply pipe 232d, the mass flow controller 241d, and the valve 243d. The first inert gas supply system may act as a purge gas supply system.

In the second gas supply pipe 232b, a mass flow controller (MFC) 241b that is a flow rate controller (flow rate control unit) and a valve 243b that is an opening/closing valve are disposed sequentially from an upstream direction. A second inert gas supply pipe 232e is connected to a downstream side lower in position than the valve 243b of the second gas supply pipe 232b. In the second inert gas supply pipe 232e, a mass flow controller 241e that is a flow rate controller (flow rate control unit) and a valve 243e that is an opening/closing valve are disposed sequentially from an upstream side. Also, the above-described second nozzle 233b is connected to a front end portion of the second gas supply pipe 232b. The second nozzle 233b is disposed in a buffer chamber 237 that is a gas diffusion space.

The buffer chamber 237 is disposed along the stack direction of the wafers 200, in an arc-shaped space between the inner wall of the reaction tube 203 and the wafers 200, and in a portion over from a lower portion to an upper portion of the inner wall of the reaction tube 203. That is, the buffer chamber 237 is disposed along a wafer arrangement area, in an area that horizontally surrounds the wafer arrangement area, at a side of the wafer arrangement area. A gas supply hole 248c for supplying a gas is disposed at an end portion of a wall adjacent to the wafer 200. The gas supply hole 248c is opened toward the center of the reaction tube 203, thereby enabling the supply of a gas toward the wafer 200. The gas supply hole 248c is disposed in plurality over from a lower portion to an upper portion of the reaction tube 203. The plurality of gas supply holes 248c have the same opening area, and are disposed at the same opening pitch.

The second nozzle 233b is configured to stand toward the upper portion of the stack direction of the wafers 200, from the lower portion to the upper portion of the inner wall of the reaction tube 203, at an end portion in which the gas supply pipe 248c of the buffer chamber 237 is disposed and at an end portion on the reverse side thereof. That is, the second nozzle 233b is disposed along the wafer arrangement area in which the wafers 200 are arranged, in an area that horizontally surrounds the wafer arrangement area, at a side of the wafer arrangement area. The second nozzle 233b is configured with a L-shaped long nozzle, a horizontal portion of the second nozzle 233b is disposed to penetrate a side wall of the manifold 209, and a vertical portion of the second nozzle 233b is configured to at least stand in a direction from one side end to the other side end of the wafer arrangement area. A gas supply hole 248b for supplying a gas is disposed at a side surface of the second nozzle 233b. The gas supply hole 248b is opened toward the center of the buffer chamber 237. Similarly to the gas supply hole 248c of the buffer chamber 237, the gas supply hole 248b is disposed in plurality over from a lower portion to an upper portion of the reaction tube 203. If a pressure difference between the inside of the buffer chamber 237 and the inside of the processing chamber 201 is small, the plurality gas supply holes 248b may have a constant opening area and a constant opening pitch from an upstream side (lower portion) to a downstream side (upper portion), but, if the pressure difference is large, the opening area becomes larger or the opening pitch becomes smaller in a direction from the upstream side to the downstream side.

In the embodiment, as described above, by adjusting the opening area or opening pitch of each of the gas supply holes 248b of the second nozzle 233b over from an upstream side to a downstream side, gases are ejected from the respective gas supply holes 248b at an almost constant flow rate although a flow velocity difference occurs between the gas supply holes 248b. The gases ejected from the respective gas supply holes 248b are first introduced into the buffer chamber 237, and a flow velocity difference between the gases become uniformed in the buffer chamber 237. That is, the particle velocity of gases ejected from the respective gas supply holes 248b of the second nozzle 233b into the buffer chamber 237 is reduced in the buffer chamber 237, and then the gases are ejected from the respective gas supply holes 248c of the buffer chamber 237 into the processing chamber 201. Therefore, the gases ejected from the respective gas supply holes 248b of the second nozzle 233b into the buffer chamber 237 have a uniform flow rate and a uniform flow velocity when the gases are ejected from the respective gas supply holes 248c of the buffer chamber 237 into the processing chamber 201.

In some embodiments, a second gas supply system is configured by the second gas supply pipe 232b, the mass flow controller 241b, and the valve 243b. Also, it may be considered that the second nozzle 233b and the buffer chamber 237 are included in the second gas supply system. Moreover, a second inert gas supply system may be mainly configured by a second inert gas supply pipe 232e, a mass flow controller 241e, and a valve 243e. The second inert gas supply system may act as the purge gas supply system.

In a third gas supply pipe 232c, a mass flow controller (MFC) 241c that is a flow rate controller (flow rate control unit) and a valve 243c that is an opening/closing valve are disposed sequentially from an upstream direction. Also, a third inert gas supply pipe 232f is connected to a downstream side lower in position than the valve 243c of the third gas supply pipe 232c. In a third inert gas supply pipe 232f, a mass flow controller 241f that is a flow rate controller (flow rate control unit) and a valve 243f that is an opening/closing valve are disposed sequentially from an upstream direction. Also, a front end portion of the third gas supply pipe 232c is connected to a downstream side lower in position than the valve 243b of the second gas supply pipe 232b.

In some embodiments, a third gas supply system is configured by the third gas supply pipe 232c, the mass flow controller 241c, and the valve 243c. Also, the second nozzle 233b and the buffer chamber 237, which are located in a downstream side lower in position than a connection portion connected to the third gas supply pipe 232c of the second gas supply pipe 232b, may be included in the third gas supply system. Further, a third inert gas supply system may be mainly configured by a third inert gas supply pipe 232f, a mass flow controller 241f, and a valve 243f. The third inert gas supply system may act as the purge gas supply system.

As described above, a gas supply method according to an embodiment of the present disclosure includes carrying gases via the inner wall of the reaction tube 203. The nozzles 233a and 233b are disposed in an arc-shaped vertical space, which is located at the end portions of the plurality of stacked wafers 200. Further, according to the gas supply method, the gases are ejected from the gas supply holes 248a to 248c which are respectively opened the nozzles 233a and 233b and the buffer chamber 237 into the reaction tube 203 with start from near the wafers 200 to form a main gas flow in the reaction tube 203 in a direction (i.e., horizontal direction) parallel to a surface of the wafer 200. According to such a configuration, a gas can be uniformly supplied to the wafers 200, thus uniformalizing a film thickness of a thin film formed in each of the wafers 200. Also, a residual gas after reaction that is a gas flowing on a surface of the wafer 200 flows toward an exhaust port, namely, a later-described exhaust pipe 231. However, a flow direction of the residual gas is appropriately specified depending on a position of the exhaust port, and is not limited to a vertical direction.

As a source gas containing a certain element and a halogen element, a source gas (silicon and chlorine-containing gas) may contain silicon (Si) as the certain element and chlorine (Cl) as the halogen element. For example, as a source gas, hexachlorodisilane (HCDS, $Si_2Cl_6$) that is a type of chlorosilane-based source gas may be supplied from the first gas supply pipe 232a into the processing chamber 201 through the mass flow controller 241a, the valve 243a, and the first nozzle 233a. That is, the first gas supply system is configured with a source gas supply system, for example, a silicon and chlorine-containing gas (HCDS gas supply system). In this case, an inert gas may be simultaneously supplied from the first inert gas supply pipe 232d into the first gas supply pipe 232a through the mass flow controller 241d and the valve 243d. Here, the chlorosilane-based source gas may be obtained by vaporizing a liquid chlorosilane-based source under a normal temperature and a normal pressure, or may be a gaseous chlorosilane-based source under the normal temperature and the normal pressure. Also, the chlorosilane-based source may become a silane-based source having a chloro group as a halogen group, and become a source that at least includes silicon (Si) and chlorine (Cl). That is, the chlorosilane-based source described herein may be a type of halide. Furthermore, in the specification, the term "source" herein may denote a liquid source having a liquid state, a gaseous source gas, or both the liquid source and the gaseous source gas. Therefore, in the specification, the term "chlorosilane-based source" herein may denote a liquid chlorosilane-based source, a gaseous chlorosilane-based source, or both the liquid chlorosilane-based source and the gaseous chlorosilane-based source. Moreover, if a liquid source is used, which is a liquid state under the normal temperature and the normal pressure such as HCDS, the liquid source is vaporized by a vaporization system such as a vaporizer or a bubbler, and supplied as a source gas (HCDS gas).

As oxygen-containing gas, for example, oxygen ($O_2$) gas is supplied from the second gas supply pipe 232b into the processing chamber 201 through the mass flow controller 241b, the valve 243b, the second gas supply pipe 232b, the second nozzle 233b, and the buffer chamber 237. That is, the second gas supply system is configured with an oxygen-containing gas supply system ($O_2$ gas supply system). In this case, an inert gas may be simultaneously supplied from the second inert gas supply pipe 232e into the second gas supply pipe 232b through the mass flow controller 241e and the valve 243e.

As a reducing gas that contains hydrogen (hydrogen-containing gas), for example, hydrogen ($H_2$) gas is supplied from the third gas supply pipe 232c into the processing chamber 201 through the mass flow controller 241c, the valve 243c, the second gas supply pipe 232b, the second nozzle 233b, and the buffer chamber 237. That is, the third gas supply system is configured with a hydrogen-containing gas supply system ($H_2$ gas supply system). In this case, an inert gas may be simultaneously supplied from the third inert gas supply pipe 232f into the third gas supply pipe 232c through the mass flow controller 241f and the valve 243f.

Moreover, in the embodiment, although $O_2$ gas and $H_2$ gas are supplied from the same nozzle into the processing chamber 201 (buffer chamber 237), $O_2$ gas and $H_2$ gas may be respectively supplied from different nozzles into the processing chamber 201. However, in the case where plural kinds of gases are supplied by a common nozzle, the number of nozzles can be reduced, thus saving the cost on devices and facilitating maintenance. Also, a nozzle for supplying HCDS gas and a nozzle for supplying $H_2$ gas may be used in common. That is, HCDS gas and $H_2$ gas may be supplied from the same nozzle. Furthermore, in a film-forming temperature zone to be described later, although HCDS gas does not react with $H_2$ gas, it is considered that HCDS gas reacts with $O_2$ gas. Thus, the nozzle for supplying HCDS gas may differ from a nozzle for supplying $O_2$ gas.

In the buffer chamber 237, as illustrated in FIG. 2, a first rod-shaped electrode 269 as a first electrode and a second rod-shaped electrode 270 as a second electrode, which have a slender and long structure are disposed along the stack direction of the wafers 200 over from the lower portion to the upper portion of the reaction tube 203. Each of the first rod-shaped electrode 269 and second rod-shaped electrode 270 is disposed in parallel to the second nozzle 233b. Each of the first rod-shaped electrode 269 and second rod-shaped electrode 270 is covered and protected by an electrode protection tube 275, which protects the respective electrodes over from an upper portion to a lower portion thereof. One of the first rod-shaped electrode 269 and second rod-shaped electrode 270 is connected to a high-frequency power source 273 through a matcher 273, and the other is connected to the ground corresponding to a reference electric potential. By applying high-frequency power from the high-frequency power source 273 to a gap between the first rod-shaped electrode 269 and the second rod-shaped electrode 270 through the matcher 272, plasma is produced in a plasma production area 224 between the first rod-shaped electrode 269 and the second rod-shaped electrode 270. In some embodiments, a plasma source that is a plasma generator (plasma generation unit) is configured by the first rod-shaped electrode 269, the second rod-shaped electrode 270, and the electrode protection tube 275. Also, the matcher 272 and the high-frequency power source 273 may be included in the plasma source. As described later, the plasma source acts as an activation unit that activates a gas in plasma.

The electrode protection tube 275 has a structure, in which the electrode protection tube 275 may be inserted into the buffer chamber 237 in a state where the first rod-shaped electrode 269 and the second rod-shaped electrode 270 are isolated from the atmosphere inside the buffer chamber 237. Here, if an internal oxygen concentration of the electrode protection tube 275 is equal to an oxygen concentration in the air (atmosphere), the first rod-shaped electrode 269 and the second rod-shaped electrode 270 inserted into the electrode protection tube 275 are oxidized with heat generated by the heater 207. Therefore, by charging the inside of the electrode protection tube 275 with an inert gas such as nitrogen gas, or purging the inside of the electrode protection tube 275 with an inert gas such as nitrogen gas using an inert gas purge unit, the internal oxygen concentration of the electrode protection tube 275 decreases, thus preventing the oxidization of the first rod-shaped electrode 269 or the second rod-shaped electrode 270.

An exhaust pipe 231 for exhausting the atmosphere inside the processing chamber 201 is disposed in the reaction tube 203. As a vacuum exhaust device, a vacuum pump 246 is connected to the exhaust pipe 231 through a pressure sensor 245 and an auto pressure controller (APC) 244. The pressure sensor 245 is a pressure detector (pressure detection unit) for detecting a pressure inside the processing chamber 201, and the auto pressure controller (APC) 244 is a pressure regulator (pressure regulation unit). When the vacuum pump 246 is operating, by opening or closing a valve, the APC valve 244 may vacuum-exhaust or stop the vacuum-exhaust inside the processing chamber 201. Also, when the vacuum pump 246 is operating, by adjusting a degree of valve opening, the APC valve 244 may regulate a pressure inside the processing chamber 201. In some embodiments, an exhaust system is configured by the exhaust pipe 231, the APC valve 244, and the pressure sensor 245. The vacuum pump 246 may be included in the exhaust system. The exhaust system may adjust the degree of valve opening of the APC valve 244 on the basis of pressure information detected by the pressure sensor 245 while operating the vacuum pump 246, thereby vacuum-exhausting the inside the processing chamber 201 such that a pressure inside the processing chamber becomes a certain pressure (degree of vacuum). Furthermore, the exhaust pipe 231 is not limited to being disposed in the reaction tube 203, and, as another example, similarly to the first nozzle 233a or the second nozzle 233b, the exhaust pipe 231 may be disposed in the manifold 209.

A seal cap 219 is disposed as a furnace opening cover for closely sealing a lower end opening of the manifold 209, under the manifold 209. The seal cap 219 is configured to contact the lower end of the manifold 209 from a vertical lower side. The seal cap 219, for example, may be formed of metal such as stainless and have a discal shape. An O ring 220b contacting the lower end of the manifold 209 is disposed as a seal member at a top of the seal cap 219. A rotation unit 267 rotating the boat 217 is disposed as a later-described substrate retention support, on the reverse side of the processing chamber 201 of the seal cap 219. A rotation axis 255 of the rotation unit 267, for example, may be formed of metal such as stainless, and connected to the boat 217 through the seal cap 219. By rotating the boat 217, the rotation unit 267 rotates the wafers 200. The seal cap 219 is vertically ascended and descended by a boat elevator 115 that is vertically disposed as an ascending/descending unit outside the reaction tube 203. By lifting and dropping the seal cap 219, the boat elevator 115 may load and unload the boat 217 into and from the processing chamber 201. That is, the boat elevator 115 is configured with a transfer device (transfer unit), which transfers the boat 217, that is, the wafers 200 into and out of the processing chamber 201. Also, a shutter 219s is disposed as a furnace opening cover for closely sealing the lower end opening of the manifold 209 while the seal cap 219 is being lifted by the boat elevator 115, under the manifold 209. Similarly to the seal cap 219, for example, the shutter 219s may be formed of metal such as stainless to have a discal shape. An O ring 220c contacting the lower end of the manifold 209 is disposed as a seal member at a top of the shutter 219s. An opening/closing operation (ascending/descending operation or rotating operation) of the shutter 219s is controlled by a shutter opening/closing unit 115s disposed outside the reaction tube 203.

The boat 217 as a substrate support may be formed of a heat-resistant material such as quartz or silicon carbide, and align the plurality of wafers 200 in a state where the wafers 200 are arranged in a horizontal posture to have a uniform center, thereby support the plurality of wafers 200 in multiple stages. Moreover, a heat insulating member 218 formed of a heat-resistant material such as quartz or silicon carbide may be disposed under the boat 217, and may prevent heat from transferring from the heater 207 to the seal cap 219. Further, the heat insulating member 218 may be configured by a plurality of heat insulating plates formed of a heat-resistant material such as quartz or silicon carbide, and a heat insulating plate holder that supports the heat insulating plates in a horizontal posture and in multiple stages.

In the reaction tube 203, as illustrated in FIG. 2, a temperature sensor 263 is disposed as a temperature detector. By regulating an electric flow to the heater 207 on the basis of temperature information detected by the temperature sensor 263, the processing chamber 201 has a desired inside temperature distribution. Similarly to the first nozzle 233a and the second nozzle 233b, the temperature sensor 263 is configured in an L-shape, and disposed along the inner wall of the reaction tube 203.

Figure 3:
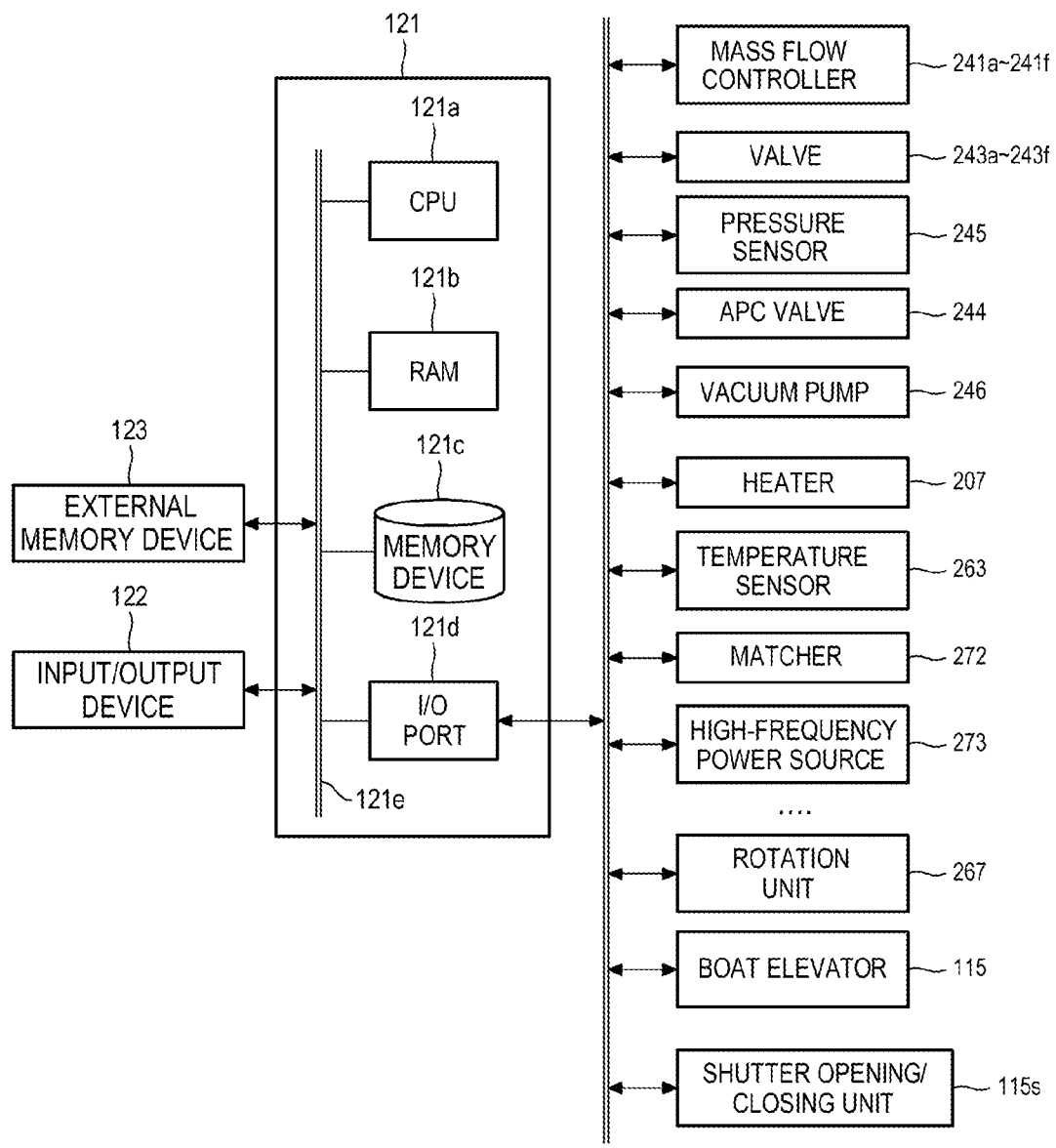
FIG. 3 is a diagram schematically illustrating a configuration of a controller of the substrate processing apparatus which is appropriately used in an embodiment of the present disclosure, and is a block diagram illustrating a control system unit of the substrate processing apparatus of FIG. 1, according to some embodiments.

As illustrated in FIG. 3, a controller 121 as a control unit (control means) includes a central processing unit (CPU) 121a, a random access memory (RAM) 121b, a memory device 121c, and an input/output (I/O) port 121d. The RAM 121b, the memory device 121c, and the I/O port 121d may exchange data with the CPU 121a through an internal bus 121e. An input/output device 122, for example configured with a touch panel or the like, may be connected to the controller 121.

The memory device 121c, for example, may be configured with a flash memory or a hard disk drive (HDD). A control program for controlling the operation of the substrate processing apparatus or a later-described process recipe, in which a sequence or condition for film formation processing or deposition-film modification treatment is described, is readably stored in the memory device 121c. Also, the process recipe is combination for obtaining a certain result by executing each sequence of a later-described substrate processing process in the controller 121, and acts as a program. Hereinafter, the process recipe or the control program is simply referred to as a program. Further, in the specification, the term "program" may herein include only a process recipe group, include only a control program group, or include both the process recipe group and the control program group. Moreover, the RAM 121b has a memory area (work area) in which a program or data read by the CPU 121a is temporarily stored.

The I/O port 121d is connected to the above-described mass flow controllers 241a to 241f, valves 243a to 243f, pressure sensor 245, APC valve 244, vacuum pump 246, heater 207, temperature sensor 263, rotation unit 267, boat elevator 115, high-frequency power source 273, matcher 272, and shutter opening/closing unit 115s.

The CPU 121a reads the control program from the memory device 121c to execute the read control program, and reads the process recipe from the memory device 121c according to a manipulation command input from the input/output device 122. Furthermore, according to details of the read process recipe, the CPU 121a controls a flow rate regulating operation of various gases performed by each of the mass flow controllers 241a to 241f, the opening/closing operation of each of the valves 243a to 243f, the opening/closing operation of the APC valve 244, a pressure regulating operation performed by the APC valve 244 based on the pressure sensor 245, a temperature regulating operation performed by the heater 207 based on the temperature sensor 263, the start and stop of the vacuum pump 246, the rotating operation and rotation speed adjusting operation of the boat 217 performed by the rotation unit 267, the ascending/descending operation of the boat 217 performed by the boat elevator 115, power supply performed by the high-frequency power source 273, an impedance regulating operation performed by the matcher 272, and the opening/closing operation of the shutter 219s performed by the shutter opening/closing unit 115s.

Moreover, the controller 121 is not limited to a dedicated computer. As another example, the controller 121 may be configured a general computer. For example, the controller 121 according to an embodiment of the present disclosure may be configured by preparing an external memory device 123 (for example, a magnetic tape, a magnetic disk such as a flexible disk or a hard disk, an optical disk such as a CD or a DVD, a magneto-optical disk such as an MO, or a semiconductor memory such as a USB memory or a memory card), which stores the above-described program and installs the program in a general computer. Also, a means for supplying a program to a computer is not limited to the external memory device 123. For example, a program may be supplied using a communication means such as the internet or a dedicated line, without using the external memory device 123. Furthermore, the memory device 121c or the external memory device 123 is configured with a non-transitory computer-readable recording medium. Hereinafter, each of the storage elements is simply referred to a record medium. Moreover, in the specification, the term "record medium" may include only the memory device 121c group, include only the external memory device 123 group, or include both the memory device 121c group and the external memory device 123 group.

(2) Substrate Processing Process

In a process of manufacturing a semiconductor device using the processing furnace of the above-described substrate processing apparatus, the following description will be made on an example of methods, which include forming a thin film on a substrate, modifying a deposition film that is formed by deposition of a reaction byproduct generated in the process container, and changing the deposition film to a robust film. Also, in the following description, operations of respective elements included in the substrate processing apparatus are controlled by the controller 121.

In the embodiment, processes are sequentially performed, which include carrying a substrate into the process container, forming a thin film on the substrate by supplying a source gas containing a certain element and a halogen element into the process container with the substrate accommodated therein, carrying the thin film-formed substrate out of the process container, and supplying an oxygen-containing gas and a hydrogen-containing gas into the heated process container under a pressure less than an atmospheric pressure in the state of not accommodating a substrate in the process container.

Moreover, when a substrate is not disposed in the process container, in the process of supplying the oxygen-containing gas and the hydrogen-containing gas into the process container, the oxygen-containing gas reacts with the hydrogen-containing gas to generate an oxidative species in the heated process container under a pressure less than the atmospheric pressure. Impurities (included in a reaction byproduct generated in the process container) such as a halogen element, etc., are removed by the generated oxidative species, and a deposition film that is formed by deposition of the reaction byproduct is modified. Also, the oxidative species used herein may be an oxidative species not containing water ($H_2O$) but containing oxygen such as atomic oxygen (O).

Figure 4:
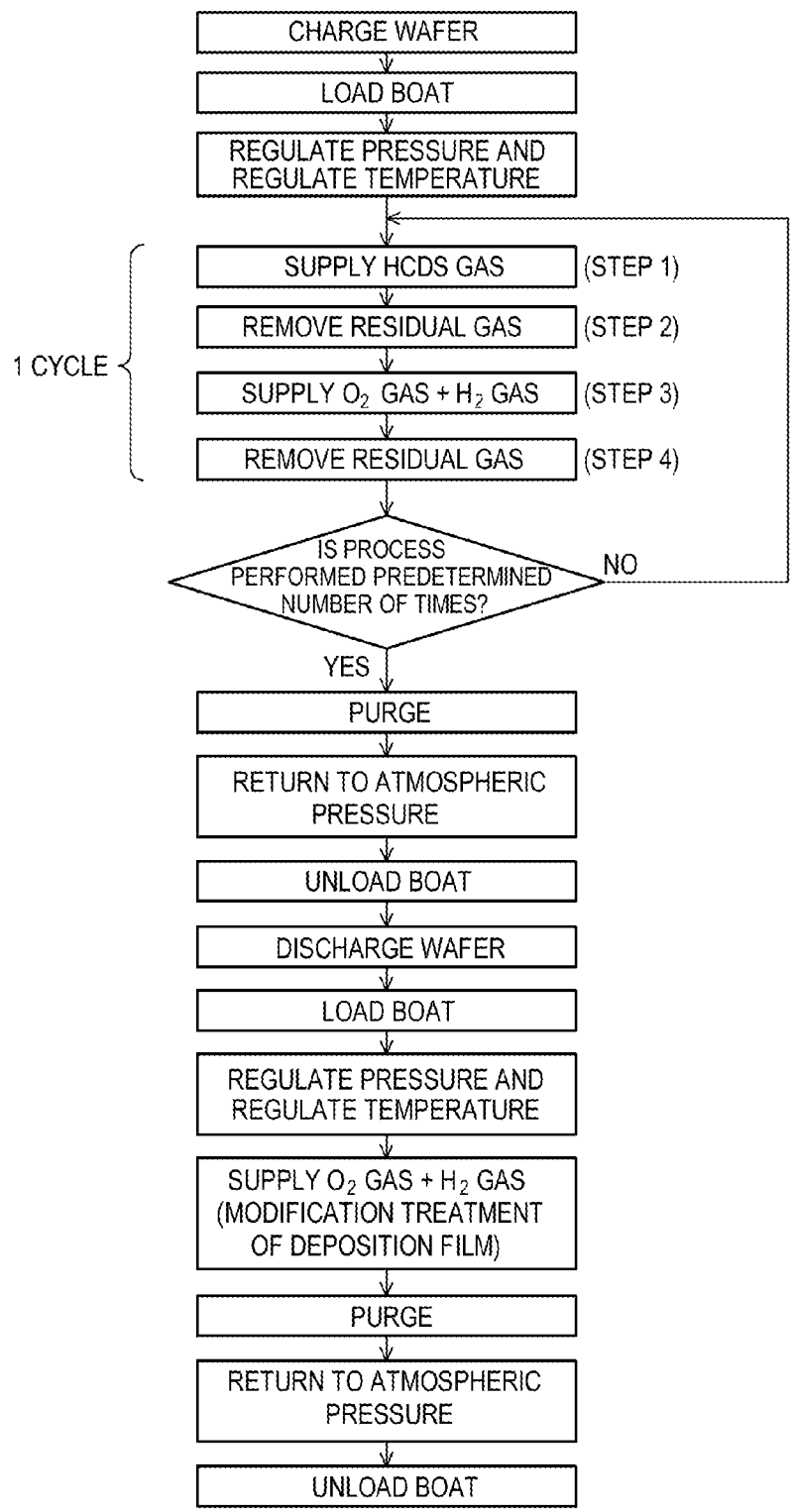
FIG. 4 is a diagram illustrating a processing flow in a first embodiment of the present disclosure.
Figure 5:
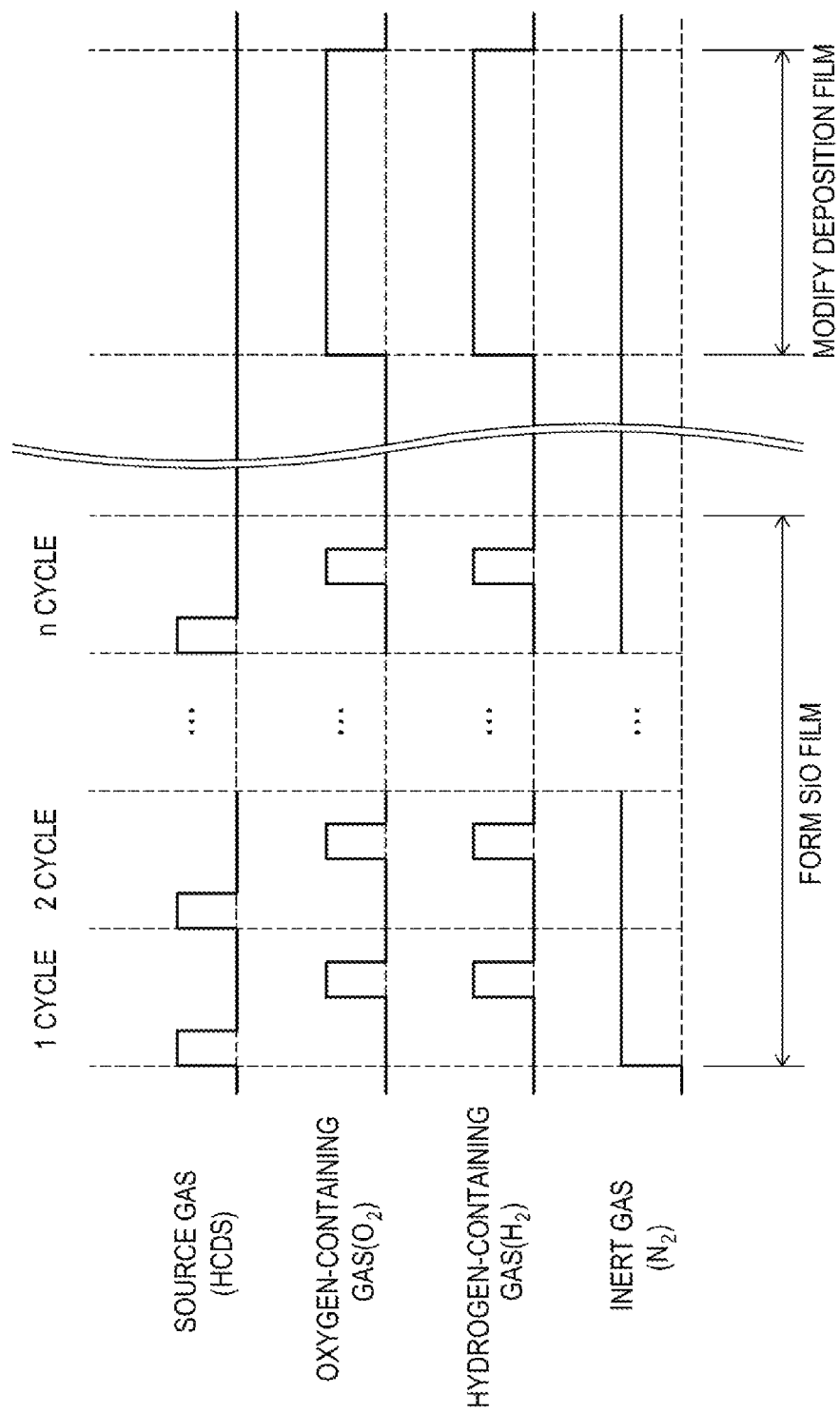
FIG. 5 is a timing chart showing gas supply timings in a film-forming sequence and a deposition film modification sequence in the first embodiment of the present disclosure.

Hereinafter, a film-forming sequence and a deposition film modifying sequence, according to some embodiments, will be described in detail with reference to FIGS. 4 and 5. FIG. 4 is a diagram illustrating a processing flow in an embodiment of the present disclosure. FIG. 5 is a timing chart showing gas supply timings in a film-forming sequence and a deposition film modifying sequence in an embodiment of the present disclosure.

In this example, the film-forming sequence uses HCDS gas as a source gas, $O_2$ gas as an oxygen-containing gas, and $H_2$ gas as a hydrogen-containing gas. A description will now be made on an example. In the example, according to some embodiments, processes may be alternately performed a predetermined number of times (one time or more), which include forming a silicon-containing layer on the wafer 200 by supplying the HCDS gas into the process container (in which the wafer 200 is placed as a substrate) and changing the silicon-containing layer to a silicon oxide layer by supplying the $O_2$ gas and the $H_2$ gas into the heated process container under a pressure less than an atmospheric pressure, thereby forming a silicon oxide film ($SiO_2$ film, hereinafter referred to as SiO film) having a predetermined composition and a predetermined thickness on the wafer 200. Also, in the process of changing the silicon-containing layer to the silicon oxide layer, a description will be made on an example, in which reacting the $O_2$ gas with the $H_2$ gas is performed to generate an oxidative species not containing water ($H_2O$) but containing oxygen such as atomic oxygen (O) in the heated process container under a pressure less than the atmospheric pressure, thereby changing the silicon-containing layer to the silicon oxide layer by using the oxidative species.

Moreover, in the deposition film modifying sequence, by using $O_2$ gas as an oxygen-containing gas and using $H_2$ gas as a hydrogen-containing gas, a description will now be made on an example, in which reacting the $O_2$ gas with the $H_2$ gas is performed to generate an oxidative species not containing water ($H_2O$) but containing oxygen such as atomic oxygen (O) in the heated process container under a pressure less than the atmospheric pressure, thereby removing impurities (included in the reaction byproduct generated in the process container) such as chlorine (Cl) by using the oxidative species, and modifying the deposition film that is formed by deposition of the reaction byproduct.

Furthermore, in the specification, the term "wafer" herein may denote a wafer itself, or a stack (set) including a wafer and a predetermined layer or film formed on a surface of the wafer (i.e., a case in which the wafer is referred to as including the predetermined layer or film formed on the surface of the wafer). Also, in the specification, the term "surface of wafer" may denote a surface (exposed surface) of a wafer itself, or a surface (i.e., the outermost surface of a wafer that is a stack) of a predetermined layer or film formed on the wafer.

Therefore, in the specification, a description of "a predetermined gas is supplied to a wafer" may denote that a predetermined gas is directly supplied to a surface (exposed surface) of a wafer itself, or to a layer or film formed on a wafer which is the outermost surface of the wafer which is a stack. Also, in the specification, a description of "a predetermined layer (or film) is formed on a wafer" may denote that a predetermined layer (or film) is directly formed on a surface (exposed surface) of a wafer itself, or a layer or film formed on a wafer which is on the outermost surface of the wafer which is a stack.

Moreover, in the specification, similarly to the case using the term "wafer", a case using the term "substrate" can be understood by replacing the term "wafer" with the term "substrate" in the above description.

<Charge of Wafer and Load of Boat>

If the plurality of wafers 200 are mounted (charged of wafer) on the boat 217, the shutter 219s is moved by the shutter opening/closing unit 115s, the lower end opening of the manifold 209 is opened (opening of shutter). As illustrated in FIG. 1, the boat 217 supporting the plurality of wafers 200 is lifted by the boat elevator 115 and loaded (load of boat) into the processing chamber 201. In this state, the seal cap 219 seals the lower end of the manifold 209 through the O ring 220b.

<Regulation of Pressure and Regulation of Temperature>

The inside of the processing chamber 201 is vacuum-exhausted by the vacuum pump 246 to have a desired pressure (degree of vacuum). At this point, a pressure inside of the processing chamber 201 is measured by the pressure sensor 245, and the APC valve 244 is feedback-controlled (regulation of pressure) on the basis of the measured pressure information. Also, the vacuum pump 246 maintains a continuous operating state until the processing of the wafer 200 is at least completed. Also, the inside of the processing chamber 201 is heated by the heater 207 to have a desired temperature. At this point, an electric flow to the heater 207 is feedback-controlled (regulation of temperature) on the basis of temperature information detected by the temperature sensor 263, in order for the inside of the processing chamber 201 to have a desired temperature distribution. The heater 207 continuously heats the inside of the processing chamber 201 until the processing of the wafer 200 is at least completed. Subsequently, the rotation unit 267 starts to rotate the boat 217 and the wafer 200. The boat 217 and the wafer 200 are continuously rotated by the rotation unit 267 until the processing of the wafer 200 is at least completed.

<Process of Forming Silicon Oxide Film>

Subsequently, the following steps 1 to 4 constitute one cycle, and, by performing the one cycle a predetermined number of times, specifically including, a plurality of times, a silicon oxide film having a predetermined film thickness is formed on the wafer 200.

<Step 1>

The valve 243a of the first gas supply pipe 232a is opened, and HCDS gas flows to the first gas supply pipe 232a. The HCDS gas flows from the first gas supply pipe 232a, and the flow rate of the HCDS gas is regulated by the mass flow controller 241a. The flow rate-regulated HCDS gas is supplied from the gas supply hole 248a of the first nozzle 233a into the processing chamber 201 having a heated depressurization state, and exhausted from the exhaust pipe 231. At this point, the HCDS gas is supplied to the wafer 200 (supply of HCDS gas).

At this point, the valve 243d of the first inert gas supply pipe 232d may be opened, and $N_2$ gas may be supplied as an inert gas from the first inert gas supply pipe 232d. The $N_2$ gas is regulated in flow rate by the mass flow controller 241*d*, and supplied into the first gas supply pipe 232*a*. The flow rate-regulated N$_2$ gas is mixed with the flow rate-regulated HCDS gas inside the first gas supply pipe 232*a*, supplied from the gas supply hole 248*a* of the first nozzle 233*a* into the processing chamber 201 having the heated depressurization state, and exhausted from the exhaust pipe 231. At this point, in order to prevent the HCDS gas from penetrating into the buffer chamber 237 or the second nozzle 233*b*, the valves 243*e* and 243*f* are opened, and the N$_2$ gas flows into the second inert gas supply pipe 232*e* and the third inert gas supply pipe 232*f*. The N$_2$ gas is supplied into the processing chamber 201 through the second gas supply pipe 232*b*, the third gas supply pipe 232*c*, the second nozzle 233*b*, and the buffer chamber 237, and exhausted from the exhaust pipe 231.

At this point, by appropriately regulating the APC valve 244, a pressure of inside the processing chamber 201 may become 1 to 13,300 Pa as an example, and specifically, may become a pressure within a range of 10 to 1,330 Pa. The supply flow rate of the HCDS gas controlled by the mass flow controller 241*a*, for example, may become a flow rate within a range of 1 to 1,000 sccm. The supply flow rate of the N$_2$ gas controlled by the mass flow controllers 241*d* to 241*f*, for example, may become a flow rate within a range of 100 to 2,000 sccm. A time taken in supplying the HCDS gas to the wafer 200, namely, a gas supply time (irradiation time) may be a time within a range of 1 to 120 sec as an example. At this point, the temperature of the heater 207 is set so that the temperature of the wafer 200 may become a temperature within a range of 350 to 800 degrees C. as an example, and specifically including, a range of 450 to 800 degrees C., and more specifically a range of 550 degrees C. to 750 degrees C.

Moreover, when the temperature of the wafer 200 is less than 350 degrees C., it becomes difficult to decompose and adsorb the HCDS gas in the wafer 200, and thus, sometime it is hard to obtain a practical depositing rate. By raising the temperature of the wafer 200 to higher than 350 degrees C., the above-described limitations can be overcome, and thus, a sufficient depositing rate is obtained. Also, by raising the temperature of the wafer 200 to higher than 450 degrees C., oxidizing power is considerably enhanced in a later-described step 3. Furthermore, by raising the temperature of the wafer 200 to higher than 550 degrees C., it becomes possible to sufficiently decompose the HCDS gas.

Moreover, when the temperature of the wafer 200 is more than 750 degrees C., and particularly, 850 degrees C., a CVD reaction becomes stronger (vaporization reaction becomes dominant), and thus, film-thickness uniformity is deteriorated, whereby it becomes difficult to control the film-thickness uniformity. By reducing the temperature of the wafer 200 to less than 800 degrees C., the deterioration of film-thickness uniformity can be prevented, and thus, it becomes possible to control the film-thickness uniformity. Especially, by reducing the temperature of the wafer 200 to less than 750 degrees C., it becomes easy to secure film-thickness uniformity, and thus, it becomes easy to control the film-thickness uniformity. Accordingly, the temperature of the wafer 200 may be set from 350 to 800 degrees C., specifically from 450 to 800 degrees C., and more specifically from 550 to 750 degrees C.

Under the above-described conditions, by supplying HCDS gas to the wafer 200, for example, a silicon-containing layer having a thickness equal to a range from less than one atomic layer to several atomic layers is formed on the wafer 200 (base film of a surface). The silicon-containing layer may be an adsorption layer of HCDS gas, or a silicon layer (Si layer), or both the adsorption layer of HCDS gas and the silicon layer. However, the silicon-containing layer may include silicon (Si) and chlorine (Cl).

Here, the silicon layer may include a discontinuous layer as well as a continuous layer formed of silicon (Si), and a silicon thin film that is formed by overlapping the discontinuous layer with the continuous layer. Also, the continuous layer formed of Si may be called a silicon thin film. Furthermore, Si forming the silicon layer includes Si for which a bond with Cl is not completely broken. However, the silicon-containing layer may include a layer containing silicon (Si) and chlorine (Cl).

Here, the silicon layer may include a discontinuous layer as well as a continuous layer formed of silicon (Si), and include a silicon thin film that is formed by overlapping the discontinuous layer with the continuous layer. Also, the continuous layer formed of Si may be called a silicon thin film. Further, Si forming the silicon layer includes Si, of which a bond with Cl is not completely broken.

Moreover, the adsorption layer of HCDS gas includes a discontinuous chemical adsorption layer as well as a continuous chemical adsorption layer of gas molecules of HCDS gas. That is, the adsorption layer of HCDS gas includes one molecular layer formed of HCDS molecules or a chemical adsorption layer having a thickness less than the one molecular layer. Also, HCDS molecules (Si$_2$Cl$_6$) forming the adsorption layer of HCDS gas include molecules (Si$_x$Cl$_y$ molecules), in which a Si—Cl bond is partially broken. That is, the adsorption layer of HCDS gas includes a continuous chemical adsorption layer or discontinuous chemical adsorption layer of Si$_2$Cl$_6$ molecules or Si$_x$Cl$_y$ molecules.

Moreover, a layer having a thickness less than one atomic layer denotes a discontinuously formed atomic layer, and a layer having a thickness of one atomic layer denotes a continuously formed atomic layer. Also, a layer having a thickness less than one molecular layer denotes a discontinuously formed molecular layer, and a layer having a thickness of one molecular layer denotes a continuously formed molecular layer.

Si is deposited on the wafer 200 to form a silicon layer under a condition in which the self-analysis (thermal decomposition) of HCDS gas is performed, namely, the thermal decomposition reaction of the HCDS gas occurs. HCDS gas is adsorbed onto the wafer 200 to form an adsorption layer of HCDS gas under a condition in which the self-analysis (thermal decomposition) of the HCDS gas is not performed, namely, the thermal decomposition reaction of the HCDS gas does not occur. Also, a depositing rate is higher in a case of forming the silicon layer on the wafer 200 than a case of forming the adsorption layer of HCDS gas on the wafer 200. Thus, the silicon layer on the wafer 200 may be formed.

If the thickness of the silicon-containing layer formed on the wafer 200 is more than several atomic layers, the effect of oxidization (modification) in a later-described step 3 is not overall exerted on the silicon-containing layer. Also, the minimum value of the thickness of the silicon-containing layer which may be formed on the wafer 200 is less than one atomic layer. Therefore, the thickness of the silicon-containing layer may be from less than one atomic layer to several atomic layers. Also, if the thickness of the silicon-containing layer is equal to or less than one atomic layer, namely, is equal to one atomic layer or less than one atomic layer, the effect of an oxidization reaction (modification reaction) in the later-described step 3 can relatively increase, and thus, the time necessary for the oxidization reaction of the step 3 can be shortened. The time necessary for forming the silicon-containing layer in the step 1 can be shortened. As a result, a processing time per one cycle can be shortened, and thus, a total processing time can be shortened. That is, it becomes possible to increase a depositing rate. Further, by setting the thickness of the silicon-containing layer to less than one atomic layer, it becomes possible to increase the controllability of film-thickness uniformity.

Furthermore, HCDS gas provided into the processing chamber 201 is supplied to the wafer 200, and moreover supplied to surfaces of members inside the processing chamber 201, which are an inner wall of the reaction tube 203, an inner wall of the manifold 209, and a surface of a member, such as the boat 217 disposed in the processing chamber 201. As a result, the above-described silicon-containing layer is formed at the surfaces of the members inside the processing chamber 201 as well as on the wafer 200. Similarly to a silicon-containing layer formed on the wafer 200, a silicon-containing layer formed at the surface of each of the members inside the processing chamber 201 may include an adsorption layer of HCDS gas, a Si layer, or both the adsorption layer of HCDS gas and the Si layer.

In the processing chamber 201, the self-analysis (thermal decomposition) of HCDS gas is more difficult in the relatively low temperature area than the relatively high temperature area. The relatively low temperature area (hereinafter referred to as a low temperature area) includes an area not surrounded by the heater 207 and an area other than an area which horizontally surrounds a wafer arrangement area. And the relatively high temperature area (hereinafter referred to as a high temperature area) includes an area surrounded by the heater 207 and an area other than an area which horizontally surrounds the wafer arrangement area. Thus, it becomes easy to form the adsorption layer of HCDS gas. Specifically, it becomes easy to form the adsorption layer of HCDS gas in a lower portion of the inner wall of the reaction tube 203, the inner wall of the manifold 209, the lower portion of the first nozzle 233a, the lower portion of the outer wall of the buffer chamber 237, the top of the seal cap 219, the side surface of the rotation axis 255, the side surface or bottom of the heat insulating member 218, and the inner wall of the exhaust pipe 231 among the members inside the processing chamber 201. Also, in the low temperature area inside the processing chamber 201, since a temperature is lower than the high temperature area, the adsorption of HCDS gas becomes easier, and it becomes easy to thickly form the adsorption layer of HCDS gas.

A source gas (silicon and chlorine-containing gas) may use tetrachlorosilane, i.e., silicontetrachloride ($SiCl_4$, STC), trichlorosilane ($SiHCl_3$, TCS), dichlorosilane ($SiH_2Cl_2$, DCS), and monochlorosilane ($SiH_3Cl$, MCS)) as well as hexachlorodisilane (HCDS, $Si_2Cl_6$). An inert gas may use rare gases, such as Ar, He, Ne, and Xe gases, as well as $N_2$ gas.

<Step 2>

A silicon-containing layer is formed on the wafer 200, and then, the valve 243a of the first gas supply pipe 232a is closed, and the supply of HCDS gas is stopped. At this point, by opening the APC valve 244 of the exhaust pipe 231, the inside of the processing chamber 201 is vacuum-exhausted by the vacuum pump 246, and unreacted HCDS gas left in the processing chamber or HCDS gas contributed to form the silicon-containing layer is removed from the inside the processing chamber 201 (removal of residual gas). At this point, by opening the valves 243d to 243f, the supply of $N_2$ gas as an inert gas into the processing chamber 201 is maintained. The $N_2$ gas acts as a purge gas, and thus, an effect in which unreacted HCDS gas left in the processing chamber or HCDS gas contributed to form the silicon-containing layer is removed from the inside of the processing chamber 201 can increase. Also, the HCDS gas adsorbed onto the members inside the processing chamber 201 in the step 1 is not completely removed by only vacuum-exhausting the inside of the processing chamber 201, and at least some of the HCDS gas is adsorbed and left onto the surfaces of the members inside the processing chamber 201.

In this case, a gas left in the processing chamber 201 may not completely be removed, and the inside of the processing chamber 201 may not completely be purged. If the amount of gas left in the processing chamber 201 is small, a bad influence does not occur in a subsequent step 3. In this case, the flow rate of $N_2$ gas supplied into the processing chamber 201 does not require a high flow rate, and for example, by supplying an amount of gas equal to the volume of the process container [processing chamber 201], purging may be performed by a degree in which a bad influence does not occur in the step 3. In this way, since the inside of the processing chamber 201 is not completely purged, a purging time is shortened, and thus, a throughput can be enhanced. Also, it becomes possible to minimize the consumption of $N_2$ gas.

In this case, the temperature of the heater 207 is set in order for the temperature of the wafer 200 to specifically 350 to 800 degrees C., more specifically including 450 to 800 degrees C., or even more specifically including 550 to 750 degrees C., similarly to a case of supplying HCDS gas. The supply flow rate of $N_2$ gas supplied as a purge gas from each of the inert gas supply systems, for example, may become a flow rate within a range from 100 to 2,000 sccm. The purge gas may use rare gases, such as Ar, He, Ne, and Xe gases, as well as $N_2$ gas.

<Step 3>

A gas left in the processing chamber 201 is removed, the valve 243b of the second gas supply pipe 232b is opened, and $O_2$ gas flows to the second gas supply pipe 232b. The $O_2$ gas flows from the second gas supply pipe 232b, and the flow rate of the $O_2$ gas is regulated by the mass flow controller 241b. The flow rate-regulated $O_2$ gas is supplied from the gas supply hole 248b of the second nozzle 233b into the buffer chamber 237, which has a heated depressurization state via the second gas supply pipe 232b. At this point, simultaneously, the valve 243c of the third gas supply pipe 232c is opened, and $H_2$ gas flows to the third gas supply pipe 232c. The $H_2$ gas flows from the third gas supply pipe 232c, and the flow rate of the $H_2$ gas is regulated by the mass flow controller 241c. The flow rate-regulated $H_2$ gas is supplied from the gas supply hole 248b of the second nozzle 233b into the buffer chamber 237 having the heated depressurization state via the third gas supply pipe 232c. Also, the $H_2$ gas is mixed with the $O_2$ gas in the second gas supply pipe 232b when passing through the second gas supply pipe 232b. That is, a mixed gas of $O_2$ gas and $H_2$ gas is supplied from the second nozzle 233b. The mixed gas of $O_2$ gas and $H_2$ gas is supplied from the gas supply hole 248c of the buffer chamber 237 into the processing chamber 201, which has the heated depressurization state, and it is exhausted from the exhaust pipe 231 (supply of $O_2$ gas+$H_2$ gas).

At this point, the valve 243e of the second inert gas supply pipe 232e may be opened, and $N_2$ gas may be supplied as an inert gas from the second inert gas supply pipe 232e. The $N_2$ gas is regulated in flow rate by the mass flow controller 241e, and supplied into the second gas supply pipe 232b. Also, the valve 243f of the third inert gas supply pipe 232f may be opened, and $N_2$ gas may be supplied as an inert gas from the third inert gas supply pipe 232f. The flow rate of the $N_2$ gas is regulated by the mass flow controller 241f, and the $N_2$ gas is supplied into the third gas supply pipe 232c. In this case, a mixed gas of $O_2$ gas, $H_2$ gas, and $N_2$ gas is supplied from the second nozzle 233b. Also, an inert gas may use rare gases, such as Ar, He, Ne, and Xe gases, as well as $N_2$ gas. At this point, also, in order to prevent the $O_2$ gas and the $H_2$ gas from penetrating into the first nozzle 233a, the valve 243d is opened, and the $N_2$ gas flows into the first inert gas supply pipe 232d. The $N_2$ gas is supplied into the processing chamber 201 through the first gas supply pipe 232a and the first nozzle 233a, and exhausted from the exhaust pipe 231.

At this point, by appropriately regulating the APC valve 244, a pressure inside of the processing chamber 201 may be maintained as less than the atmospheric pressure, and for example, maintained as a pressure within a range of 10 to 1,000 Pa. The supply flow rate of the $O_2$ gas controlled by the mass flow controller 241a, for example, may become a flow rate within a range of 1,000 to 10,000 sccm. The supply flow rate of the $H_2$ gas controlled by the mass flow controller 241c, for example, may become a flow rate within a range of 1,000 to 10,000 sccm. The supply flow rate of the $N_2$ gas controlled by the mass flow controllers 241d to 241f, for example, may become a flow rate within a range of 100 to 2,000 sccm. A time taken in supplying the $O_2$ gas and $H_2$ gas to the wafer 200, namely, a gas supply time (irradiation time) may be a time within a range of 1 to 120 sec as an example. The temperature of the heater 207 is set in order for the temperature of the wafer 200 to become a temperature zone (which is the same a temperature zone set in supplying HCDS gas in the step 1), in which the later-described enhancement effect of oxidizing power becomes considerable, namely, a range of 450 to 800 degrees C., and specifically including a range of 550 to 750 degrees C. Also, in the temperature within the range, it has been checked that the enhancement effect (described later) of oxidizing power by addition of $H_2$ to $O_2$ gas becomes considerable under a depressurization atmosphere. Also, when the temperature of the wafer 200 is excessively low, it has been checked that the enhancement effect of oxidizing power is not obtained. Considering a throughput, in this way, the temperature of the heater 207 may be set so as to maintain a temperature inside the processing chamber 201 in the same temperature zone in the steps 1 to 3. Also, the temperature of the heater 207 may be set so as to maintain the temperature inside of the processing chamber 201 in the same temperature zone over the step 1 to a step 4 (described later). In this case, for example, the temperature of the heater 207 may be set in order for the temperature inside the processing chamber 201 to become a certain temperature within a range of 450 to 800 degrees C. and specifically including 550 to 750 degrees C. over the step 1 to the step 4 (described later).

By supplying $O_2$ gas and $H_2$ gas into the processing chamber 201 under the above-described condition, the $O_2$ gas and $H_2$ gas are thermally activated (excited) to non-plasma and react under a heated depressurization atmosphere, thereby generating an oxidative species not containing water ($H_2O$) but containing oxygen such as atomic oxygen (O). Furthermore, a silicon-containing layer formed on the wafer 200 in the step 1 may be oxidized mainly by the oxidative species. The energy of the oxidative species is higher than the bond energy of Si—N, Si—Cl, Si—H, and Si—C contained in the silicon-containing layer, and thus, by applying the energy of the oxidative species to the silicon-containing layer, each of Si—N, Si—Cl, Si—H, and Si—C bonds contained in the silicon-containing layer is separated. N, H, Cl, and C separated from a bond with Si are removed from among a film, and respectively discharged as $N_2$, $H_2$, $Cl_2$, and $C_2$. Also, the bonds with N, H, Cl, and C are broken, and thus, bonding electrons of left Si is combined with O contained in the oxidative species to form a Si—O bond. Therefore, the silicon-containing layer is changed (modified) to a silicon oxide layer ($SiO_2$ layer, hereinafter referred to as a SiO layer simply) in which the content of impurities such as chlorine (Cl) is low. According to the oxidizing, oxidizing power can be more enhanced than a case of separately supplying $O_2$ gas or a case of supplying vapor ($H_2O$). That is, by adding $H_2$ gas to $O_2$ gas under the depressurization atmosphere, the considerable enhancement effect of oxidizing power is obtained compared to the case of separately supplying $O_2$ gas or the case of supplying $H_2O$ gas.

Moreover, an oxidative species generated in the processing chamber 201 is supplied to the wafer 200, and moreover supplied to the surfaces of the members inside the processing chamber 201. As a result, some of the silicon-containing layers formed on the surfaces of the members inside the processing chamber 201 are changed (modified) to silicon oxide layers which are similar to a silicon oxide layer formed on the wafer 200. However, in a low temperature area inside the processing chamber 201, a temperature is lower than a high temperature area. And, the amount of supplied oxidative species is reduced, which does not contain water ($H_2O$) but contain oxygen such as atomic oxygen (O). Also, as described above, in the low temperature area inside the processing chamber 201, an adsorption layer of HCDS gas may be formed thicker than the high temperature area. As a result, silicon-containing layers formed in the low temperature area do not react, or some of the silicon-containing layers react, and thus may be left in an insufficient oxidization state. Specifically, adsorption layers of HCDS gas, which are respectively formed on the lower portion of the inner wall of the reaction tube 203, the inner wall of the manifold 209, the lower portion of the first nozzle 233a, the lower portion of the outer wall of the buffer chamber 237, the top of the seal cap 219, the side surface of the rotation axis 255, the side surface or bottom of the heat insulating member 218, and the inner wall of the exhaust pipe 231 among the members inside of the processing chamber 201, do not react, or some of the adsorption layers of HCDS gas react, and thus may be left in a sufficient oxidization state.

Furthermore, in the step 3, at least one or all of $O_2$ gas and $H_2$ gas may be activated to plasma and discharged. As $O_2$ gas and/or $H_2$ gas are/is activated to plasma and discharged, an oxidative species including an active species having relative higher energy may be generated, and, by performing oxidization processing with the oxidative species, a device characteristic can be enhanced. For example, if all of the $O_2$ gas and $H_2$ gas are activated to plasma, by applying high-frequency power from the high-frequency power source 273 to a gap between the first rod-shaped electrode 269 and the second rod-shaped electrode 270 through the matcher 272, a mixed gas of $O_2$ gas and $H_2$ gas supplied into the buffer chamber 237 is activated to plasma (excited to plasma), supplied as a gas containing an active species (i.e., a gas containing $O_2$ (active species of oxygen) or $H_2$ (active species of hydrogen)) from the gas supply hole 248c into the processing chamber 201, and exhausted from the exhaust pipe 231. At this point, for example, the high-frequency power applied from the high-frequency power source 273 to the gap between the first rod-shaped electrode 269 and the second rod-shaped electrode 270 may be set within a range of 50 to 1,000 W. A processing condition other than the above power condition is similar to the above-described processing condition. Also, in the above-described temperature zone, the $O_2$ gas and the $H_2$ gas are activated by heat and sufficiently react, thereby sufficiently generating an oxidative species not containing water ($H_2O$) but containing oxygen such as atomic oxygen (O). Therefore, even when the $O_2$ gas and the $H_2$ gas are thermally activated to non-plasma, sufficient oxidizing power is obtained. Further, when the $O_2$ gas and the $H_2$ gas are activated by heat and supplied, a relative soft reaction can be performed without plasma damage, and thus, the above-described oxidization processing can be performed relatively softly.

Ozone ($O_3$) gas as well as oxygen ($O_2$) gas may be used as an oxygen-containing gas, that is, an oxidizing gas. Also, in the above-described temperature zone, a test on an effect which is obtained by adding a hydrogen-containing gas as nitric oxide (NO) gas or nitrous oxide ($N_2O$) gas, has not shown that oxidizing power is more enhanced than a case of separately supplying the NO gas or a case of separately supplying the $N_2O$ gas. That is, as the oxygen-containing gas, an oxygen-containing gas not containing nitrogen, which does contain oxygen but not contain nitrogen, may be used. Deuterium ($D_2$) gas as well as hydrogen ($H_2$) gas may be used as a hydrogen-containing gas, namely, a reducing gas. Also, if ammonia ($NH_3$) gas or methane ($CH_4$) gas is used, nitrogen (N) impurities or carbon (C) impurities may be adulterated into a film. That is, as the hydrogen-containing gas, a hydrogen-containing gas not containing other element, which contain no other element but contain hydrogen or deuterium, may be used. That is, at least one gas selected from the group consisting of $O_2$ gas and $O_3$ gas may be used as the oxygen-containing gas, and at least one gas selected from the group consisting of $H_2$ gas and $D_2$ gas may be used as the hydrogen-containing gas.

<Step 4>

A silicon-containing layer is changed to a silicon oxide layer, and then, the valve 243b of the second gas supply pipe 232b is closed, and the supply of $O_2$ gas is stopped. Also, the valve 243c of the third gas supply pipe 232c is closed, and the supply of $H_2$ gas is stopped. At this point, in the state of opening the APC valve 244 of the exhaust pipe 231, the inside of the processing chamber 201 is vacuum-exhausted by the vacuum pump 246, and residual $O_2$ gas or $H_2$ gas or a reaction byproduct is removed from the inside the processing chamber 201 (removal of residual gas). Further, while opening the valves 243e, 243f and 243d, the supply of $N_2$ gas as an inert gas into the processing chamber 201 is maintained. The $N_2$ gas acts as a purge gas, and thus, an effect in which unreacted $O_2$ gas or $H_2$ gas left in the processing chamber 201, or $O_2$ gas or $H_2$ gas contributed to form the silicon oxide layer, or the reaction byproduct is removed from the inside the processing chamber 201 can more increase.

In this case, a gas left in the processing chamber 201 may not completely be removed, and the inside of the processing chamber 201 may not completely be purged. If the amount of gas left in the processing chamber 201 is small, a bad influence does not occur in the step 1. In this case, the flow rate of $N_2$ gas supplied into the processing chamber 201 does not require a high flow rate, and for example, by supplying an amount of gas equal to the volume of the reaction tube 203 [processing chamber 201], purging may be performed by a degree in which a bad influence does not occur in the step 1. In this way, since the inside of the processing chamber 201 is not completely purged, a purging time is shortened, and thus, a throughput can be enhanced. Further, it becomes possible to minimize the consumption of $N_2$ gas.

In this case, for example, the temperature of the heater 207 is set in order for the temperature of the wafer 200 to become 450 to 800 degrees C., or specifically including 550 to 750 degrees C., similarly to a case of supplying $O_2$ gas and $H_2$ gas. The supply flow rate of $N_2$ gas supplied as a purge gas from each of the inert gas supply systems, for example, may become a flow rate within a range from 100 to 2,000 sccm. The purge gas may use rare gases, such as Ar, He, Ne, and Xe gases, as well as $N_2$ gas.

<Predetermined Number of Timed-Performance>

The above-described steps 1 to 4 constitute one cycle, and, by performing the one cycle predetermined number of times, and specifically, a plurality of times (n times), a silicon oxide film ($SiO_2$ film) having a predetermined film thickness is formed on the wafer 200.

Moreover, if the cycle is performed a plurality of times, in each step subsequent to at least a second cycle, a description of "a predetermined gas is supplied to the wafer 200" may denote that a predetermined gas is supplied to a layer formed on the wafer 200, namely, to the outermost surface of the wafer 200 which is a stack. And, a description of "a predetermined layer is formed on the wafer 200" may denote that a predetermined gas is formed on a layer formed on the wafer 200, namely, on the outermost surface of the wafer 200 which is a stack. This is as described above. Also, this is applied to later-described modification examples or another embodiment.

<Return to Purge and Atmospheric Pressure>

If a silicon oxide film having a predetermined film thickness is formed, the valves 243d to 243f are opened, and $N_2$ gas is supplied as an inert gas from each of the first inert gas supply pipe 232d, the second inert gas supply pipe 232e, and the third inert gas supply pipe 232f into the processing chamber 201, and exhausted from the exhaust pipe 231. The $N_2$ gas acts as a purge gas, and thus, the inside of the processing chamber 201 is purged with the inert gas, and a gas left in the processing chamber 201 is removed from the processing chamber 201 (purge). Subsequently, the atmosphere inside of the processing chamber 201 is replaced with the inert gas, and a pressure inside the processing chamber 201 returns to a normal pressure (return to atmospheric pressure).

<Unload of Boat and Discharge of Wafer>

Subsequently, the seal cap 219 is dropped by the boat elevator 115, and thus, the lower end of the manifold is opened, and a processed wafer 200 is unloaded (unload of boat) from the lower end of the manifold 209 to the outside of the reaction tube 203 while being retained and supported by the boat 217. After the boat 217 is unloaded, the shutter 219s is moved by the shutter opening/closing unit 115s, and thus, the lower end opening of the manifold 209 is sealed (closing of shutter) by the shutter 219s through the O ring 220c. Then, the processed wafer 200 is taken out from the boat 217 (discharge of wafer).

Moreover, when the boat 217 is unloaded, the air (atmosphere) containing water ($H_2O$) penetrates from the lower opening of the manifold 209 into the processing chamber 201. Also, the top of the seal cap 219, the side surface of the rotation axis 255, and the side surface or bottom of the heat insulating member 218 are exposed to the atmosphere containing water ($H_2O$). As described above, an adsorption layer of HCDS gas may be formed in the lower portion of the inner wall of the reaction tube 203, the inner wall of the manifold 209, the lower portion of the first nozzle 233a, the lower portion of the outer wall of the buffer chamber 237, the top of the seal cap 219, the side surface of the rotation axis 255, the side surface or bottom of the heat insulating member 218, and the inner wall of the exhaust pipe 231 among the members inside of the processing chamber 201, and may be left in an insufficient oxidization state. In this state, when the boat 217 is unloaded, the adsorption layer of HCDS gas may be oxidized by water ($H_2O$) in the atmosphere, and changed to a reaction byproduct containing chlorine (Cl). Furthermore, the reaction byproduct is deposited to form a film (deposition film), and, since the deposition film is relatively vulnerable, the deposition film can be easily exfoliated, causing foreign materials (particles).

Hereinafter, an operation will be described with reference to FIG. 6, in which an adsorption layer of HCDS gas formed on the surface of each member inside of the processing chamber 201 is changed to a reaction byproduct containing Cl by reacting with water ($H_2O$) in the atmosphere and a portion of a deposition film formed by the deposition of the reaction byproduct is exfoliated to cause foreign materials.

Figure 6A:
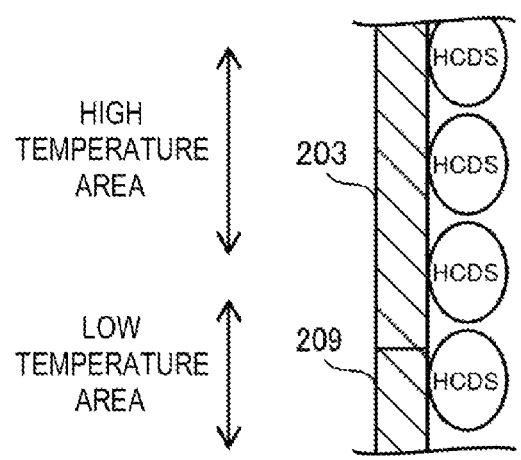
FIG. 6A is a view illustrating an operation in which an adsorption layer of source gas (HCDS gas) is formed in a process container.

By performing the above-described step 1 (supply of HCDS gas), as shown in FIG. 6A, silicon-containing layers are respectively formed at the members inside the processing chamber 201, for example, the inner wall of the reaction tube 203, the inner wall of the manifold 209, etc. As described above, in a high temperature area inside the processing chamber 201, an adsorption layer of HCDS gas may be formed, a Si layer may be formed, or both the adsorption layer of HCDS and the Si layer may be formed. Also, in the low temperature area inside the processing chamber 201, it is difficult to perform the self-analysis (thermal decomposition) of HCDS gas, and it becomes easy to form an adsorption layer of HCDS gas. In FIG. 6A, as an example, an operation is illustrated, in which an adsorption layer of HCDS gas is formed in both the high temperature area and low temperature area inside the processing chamber 201.

Figure 6B:
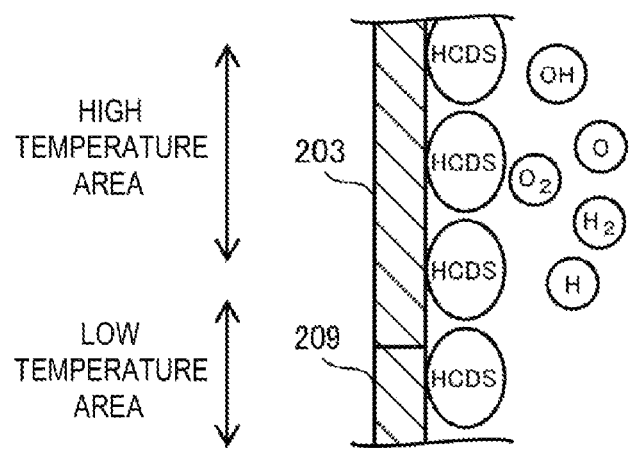
FIG. 6B is a view illustrating an operation in which an oxidative species is supplied to the adsorption layer of a source gas formed in a processing chamber.

Then, by performing the above-described step 3 (supply of $O_2$ gas+$H_2$ gas), as illustrated in FIG. 6B, an oxidative species not containing water ($H_2O$) but containing oxygen such as atomic oxygen (O) is supplied to an adsorption layer of HCDS gas. The HCDS gas is formed in the high temperature area inside the processing chamber 201. The adsorption layer of HCDS gas formed in the high temperature area inside of the processing chamber 201 is oxidized by the oxidative species not containing water ($H_2O$) but containing oxygen such as atomic oxygen (O), and changed to a silicon oxide layer. The silicon oxide layer is a layer that is formed by oxidizing the adsorption layer of HCDS gas using an oxidative species having strong oxidizing power under a high temperature condition equal to the temperature (for example, 450 to 800 degrees C., and specifically including 550 to 750 degrees C.) of the wafer 200. Since there are few impurities such as chlorine (Cl), the silicon layer is stable, dense and strong in bonding force (bonding force between composition materials) of a structure.

Figure 6C:
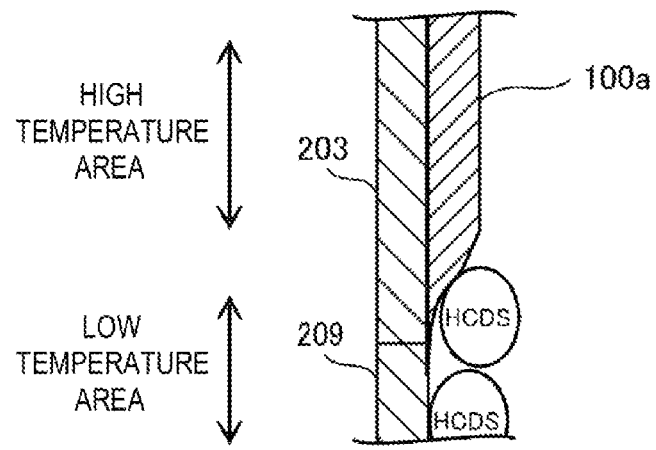
FIG. 6C is a view illustrating an operation in which the adsorption layer of source gas formed within a low temperature range in the processing chamber is left without being oxidized.

Subsequently, a cycle including the above-described steps 1 to 4 is performed predetermined number of times. Thus, as illustrated in FIG. 6C, a strong silicon oxide film 100a, which is formed by the deposition of the above-described silicon oxide layer and is difficult to exfoliate, is formed in the high temperature area inside the processing chamber 201. Furthermore, the silicon oxide film 100a is difficult to be formed in the low temperature area inside of the processing chamber 201. That is, a plurality of the adsorption layers of HCDS gas formed in the low temperature area inside the processing chamber 201 do not react, or some of the adsorption layers of HCDS gas react, and thus, as illustrated in FIG. 6C, adsorption layers of HCDS gas may be left in an insufficient oxidization state. This is because the low temperature area is low in temperature, the amount of supplied oxidative species is smaller than the high temperature area, and each of the adsorption layers of HCDS gas is more thickly formed in the low temperature area than the high temperature area in the processing chamber 201.

Figure 6D:
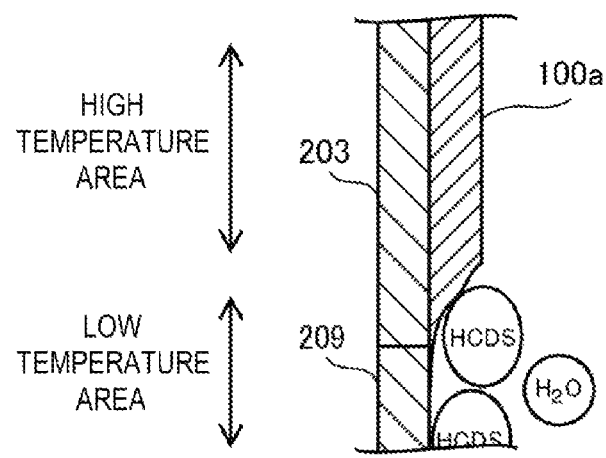
FIG. 6D is a view illustrating an operation in which water ($H_2O$) in the atmosphere is supplied to the adsorption layer of source gas formed within the low temperature region in the processing chamber.

If the boat 217 is unloaded after the silicon oxide film is formed on the wafer 200, the normal-temperature atmosphere penetrates into the processing chamber 201 (particularly, near a furnace opening). Furthermore, as illustrated in FIG. 6D, water ($H_2O$) in the atmosphere is supplied to the adsorption layer of HCDS gas that is left in an insufficient oxidization state. The adsorption layer of HCDS gas is oxidized by water ($H_2O$) in the atmosphere, and changed to a reaction byproduct. Since the reaction byproduct is generated by oxidizing the adsorption layer of HCDS gas with water ($H_2O$) having low oxidizing power in the normal-temperature atmosphere, the reaction byproduct contains many impurities such as chlorine (Cl), and is an unstable material having active (oxidative) properties.

Figure 6E:
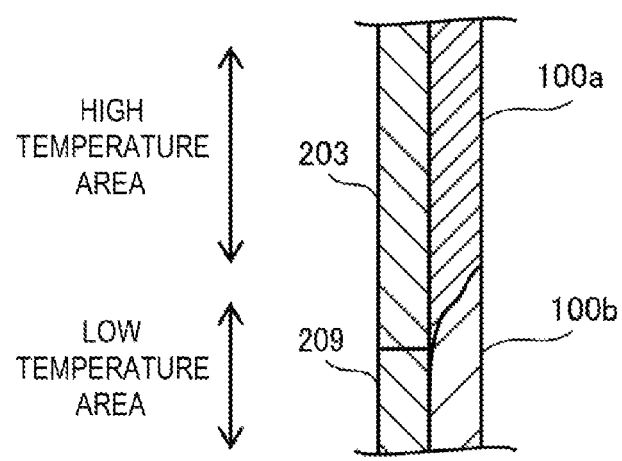
FIG. 6E is a view illustrating an operation in which a deposition film is formed by deposition of a reaction byproduct within the low temperature region in the processing chamber.
Figure 7:
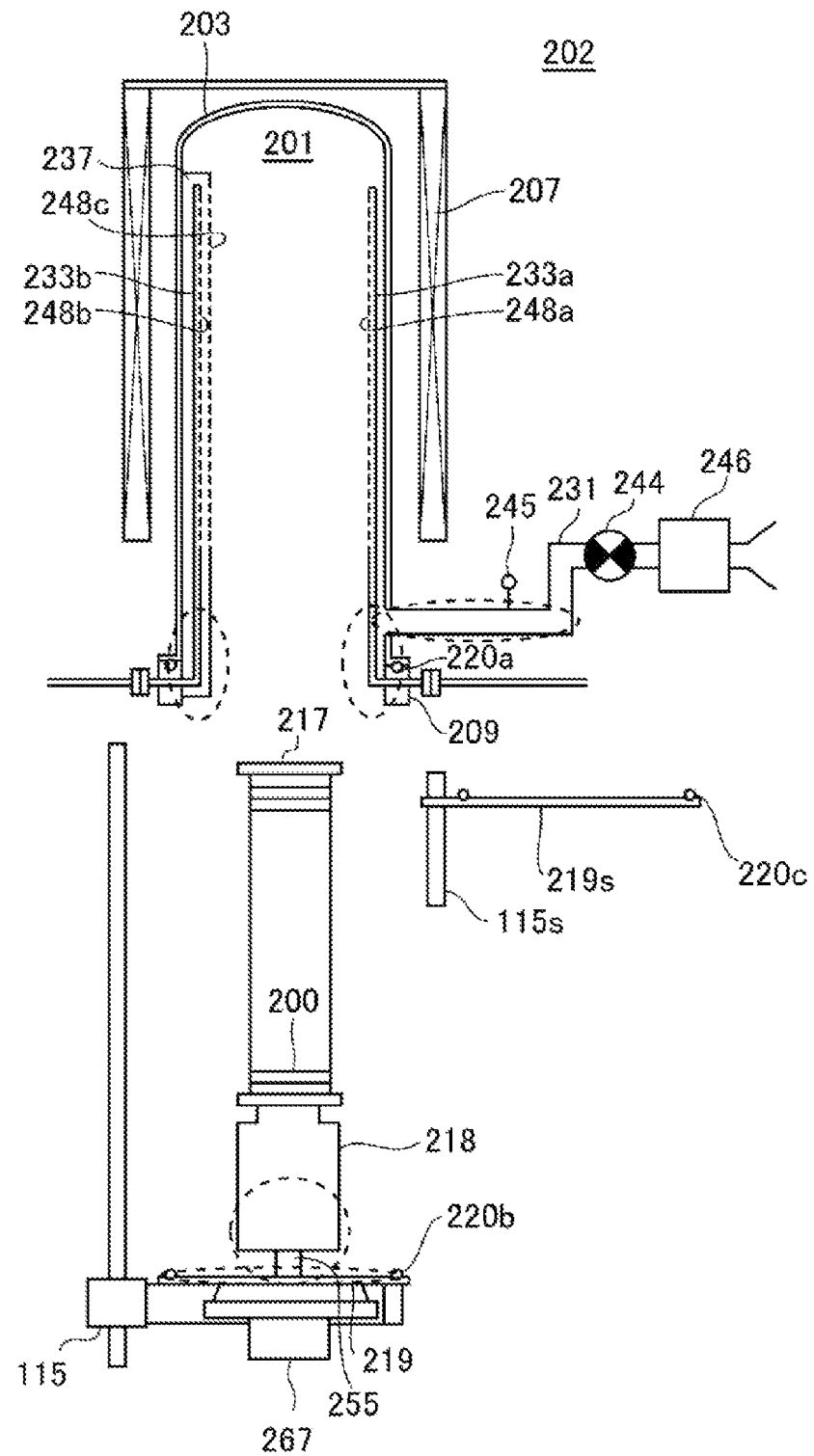
FIG. 7 is a view for describing an area in which a reaction byproduct is easily produced when a boat is unloaded.

Subsequently, processing (hereinafter referred to as batch processing) from the above-described charge of the wafer to the discharge of the wafer is performed predetermined number of times, and thus, as illustrated in FIG. 6E, a deposition film 100b formed by the deposition of the reaction byproduct is formed in the low temperature area inside the processing chamber 201. The deposition film 100b, as described above, contains many impurities such as chlorine (Cl) and is formed by the deposition of unstable materials, which have active (oxidative) properties. Moreover, the deposition film 100b is weak in bonding force of a structure thereof and is low in density. Therefore, the deposition film 100b is vulnerable compared to the silicon oxide film 100a formed in the high temperature area, and thus has properties easy to exfoliate. Also, in FIG. 7, an area in which a reaction byproduct is easily generated in unloading the boat 217 is illustrated as a dotted line. As illustrated in FIG. 7, a plurality of reaction byproducts are respectively generated at the lower portion of the inner wall of the reaction tube 203, the inner wall of the manifold 209, the top of the seal cap 219, the side surface of the rotation axis 255, the side surface or bottom of the heat insulating member 218, and the inner wall of the exhaust pipe 231. That is, a plurality of the deposition films 100b are respectively formed on the lower portion of the inner wall of the reaction tube 203, the inner wall of the manifold 209, the top of the seal cap 219, the side surface of the rotation axis 255, the side surface or bottom of the heat insulating member 218, and the inner wall of the exhaust pipe 231.

Figure 6F:
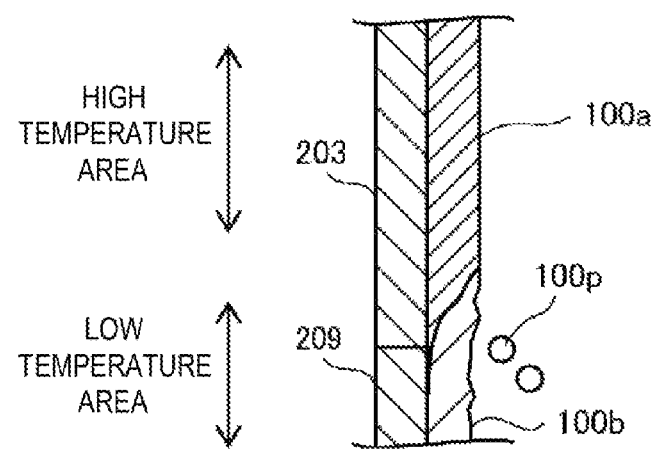
FIG. 6F is a view illustrating an operation in which foreign materials are produced from the deposition film.
Figure 8:
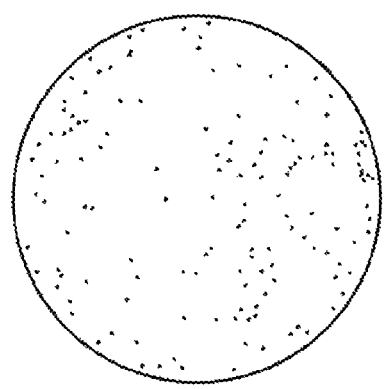
FIG. 8 is a view illustrating a state in which foreign materials are adhered to a substrate.

FIG. 6F is a view illustrating an operation in which foreign materials 100p are produced inside of the processing chamber 201 by exfoliating the deposition film 100b. Also, FIG. 8 is a view illustrating a state, in which the foreign materials 100p are adhered to the surface of the wafer 200. If the foreign materials 100p are adhered to the wafer 200, the quality of a semiconductor device to be manufactured can be degraded. For example, the foreign materials 100p adhered to the wafer 200 are introduced into a thin film formed on the wafer 200, causing a reduction in film quality. Also, for example, in an operation in which the exposure drawing of an integrated circuit is performed on the thin film-formed wafer 200, when the wafer 200 with the foreign materials adhered thereto is mounted on an exposer stage, the foreign materials 100p may enter between the stage and wafer 200. Thus, an optical system of an exposure device and the wafer 200 deviate from each other in distance (deviation of a focus distance), causing the deterioration of drawing accuracy. Furthermore, for example, the foreign materials 100p enter into an opening between lines formed the surface of the wafer 200, or cover the opening, and thus, in a subsequent process of forming a thin film, it becomes difficult to form the thin film in the opening. Moreover, to prevent the production of the foreign materials 100p, it may be considered that cleaning in the processing chamber 201 is performed at a high frequency, but, in this case, the maintenance time (stop time, namely, downtime) of the substrate processing apparatus increases, causing a decrease in productivity.

Furthermore, the reaction byproduct forming the deposition film 100b contains a large amount of chlorine (Cl), and thus has properties easy to generate a chlorine-containing gas. The chlorine-containing gas generated from the deposition film 100b can exert a bad influence on the body of a maintenance worker or an operator. Also, the reaction byproduct forming the deposition film 100b has active (oxidative) properties because containing chlorine (Cl), and thus, damages such as corrosion can be caused to the metal members such as the manifold 209, the seal cap 219, and the rotation axis 255. As a result, the frequency of maintenance of the substrate processing apparatus increases, and thus, productivity is reduced. Moreover, foreign materials are produced from a metal member getting damage, causing the degradation of quality of a semiconductor device.

Accordingly, in the embodiment, to overcome the limitations, the wafer 200 is discharged, and then, processing is performed, in which the deposition film 100b formed in the processing chamber 201 is modified and changed to a strong film difficult to exfoliate. Hereinafter, the processing operation will be described in detail.

<Load of Boat>

The shutter 219s is moved by the shutter opening/closing unit 115s, and thus, the lower end opening of the manifold 209 is opened (opening of shutter). An empty boat 217, on which the wafer 200 is not mounted, is lifted by the boat elevator 115, and loaded into the processing chamber 201 (load of boat). In this state, the seal cap 219 seals the lower end of the manifold 209 through the O ring 220b.

<Regulation of Pressure and Regulation of Temperature>

Subsequently, the inside of the processing chamber 201 is vacuum-exhausted by the vacuum pump 246 to have a desired pressure (degree of vacuum). At this point, a pressure inside of the processing chamber 201 is measured by the pressure sensor 245, and the APC valve 244 is feedback-controlled (regulation of pressure) on the basis of the measured pressure information. Also, the vacuum pump 246 maintains a continuous operating state at least until the modification treatment of the deposition film 100b is completed. Furthermore, the inside of the processing chamber 201 is heated by the heater 207 to have a desired temperature. At this point, an electric flow to the heater 207 is feedback-controlled (regulation of temperature) on the basis of temperature information detected by the temperature sensor 263, in order for the inside of the processing chamber 201 to have a desired temperature distribution. Further, the heater 207 continuously heats the inside of the processing chamber 201 at least until the modification treatment of the deposition film 100b is completed. Subsequently, the rotation unit 267 starts to rotate the boat 217. Moreover, the boat 217 is continuously rotated by the rotation unit 267 at least until the modification treatment of the deposition film 100b is completed. At this point, however, the boat 217 may not be rotated.

<Modification Treatment of Deposition Film>

Subsequently, the same step as the above-described step 3 is performed. That is, when the wafer 200 is not disposed in the processing chamber 201, $O_2$ gas and $H_2$ gas are supplied into the processing chamber 201 having a heated depressurization state, and exhausted from the exhaust pipe 231 (supply of $O_2$ gas and $H_2$).

In this case, a sequence and processing condition is approximately similar to the above-described step 3. The temperature of the heater 207 may be set so that the $O_2$ gas and the $H_2$ gas react to generate an oxidative species in the processing chamber 201. Also, the temperature of the heater 207 may be set so that an oxidative species not containing water ($H_2O$) but containing oxygen such as atomic oxygen (O) is generated in the processing chamber 201. For example, a temperature inside the processing chamber 201 may be set as a temperature equal to a temperature inside the processing chamber 201 which has already been set in the above-described process of forming the silicon oxide film, and for example, may be set as a temperature within a range of 450 to 800 degrees C., and specifically, a range of 550 to 750 degrees C. Furthermore, for example, a time taken in supplying $O_2$ gas and the $H_2$ gas into the processing chamber 201 may be set as a time within a range of 20 to 120 min, specifically 20 to 60 min, and more specifically 20 to 40 min.

By supplying $O_2$ gas and $H_2$ gas into the processing chamber 201 under the above-described condition, the $O_2$ gas and $H_2$ gas are thermally activated (excited) to non-plasma and react under the heated depressurization atmosphere, thereby generating an oxidative species not containing water ($H_2O$) but containing oxygen such as atomic oxygen (O). Furthermore, a silicon-containing layer formed on the wafer 200 in the step 1 may be oxidized mainly by the oxidative species. The energy of the oxidative species is higher than the bond energy of Si—N, Si—Cl, Si—H, and Si—C contained in the silicon-containing layer, and thus, by applying the energy of the oxidative species to the silicon-containing layer, each of Si—N, Si—Cl, Si—H, and Si—C bonds contained in the silicon-containing layer is separated. N, H, Cl, and C separated from a bond with Si are removed from among a film, and respectively discharged as $N_2$, $H_2$, $Cl_2$, HCl and $C_2$. Also, the bonds with N, H, Cl, and C are broken, and thus, remaining bond numbers of Si are combined with O contained in the oxidative species to form a Si—O bond. Therefore, a reaction byproduct forming the deposition film 100b is low in content of impurities such as chlorine (Cl), and thus is changed (modified) to a stable material. As a result, the deposition film 100b formed in the processing chamber 201 is modified to a film that has a strong bonding force in a structure thereof and high density, namely, a strong film difficult to exfoliate. Furthermore, according to the modification treatment, oxidizing power can be far more enhanced than a case of separately supplying $O_2$ gas or a case of supplying vapor ($H_2O$). That is, by adding $H_2$ gas to $O_2$ gas under the depressurization atmosphere, the considerable enhancement effect of oxidizing power may be obtained compared to that of oxidizing power when separately supplying $O_2$ gas or $H_2O$ gas.

Moreover, the temperature of the heater 207 may be set so that a temperature inside of the processing chamber 201 becomes higher than a temperature inside of the processing chamber 201. Here, the temperature inside of the processing chamber 201 is set in the above-described process of forming the silicon oxide film. For example, the temperature of the heater 207 may be set so that a temperature inside of the processing chamber 201 becomes a temperature within a range of 450 to 900 degrees C. and specifically a range of 600 to 800 degrees C. In this case, the amount of generated oxidative species can increase, and oxidizing power by oxidative species can more increase, thus enabling the modification of the deposition film 100b to be performed more efficiently. However, when a temperature inside the processing chamber 201 in modifying the deposition film increases to a temperature equal to a temperature inside the processing chamber 201. Here, the temperature inside the processing chamber 201 is set in the above-described process of forming the silicon oxide film. The time necessary for temperature-rising and temperature-falling may not be spent, and thus, the time can be saved in a total time in modifying the deposition film 100b.

Moreover, at least one or all of $O_2$ gas and $H_2$ gas may be activated to plasma and discharged. As $O_2$ gas and/or $H_2$ gas are/is activated to plasma and discharged, oxidizing power by oxidative species can more increase, thus enabling the modification of the deposition film 100b to be performed more efficiently.

<Return to Purge and Atmospheric Pressure>

If the deposition film is modified, the valve 243b of the second gas supply pipe 232b and the valve 243c of the third gas supply pipe 232c are closed, and the supply of $O_2$ gas and $H_2$ gas into the processing chamber 201 is stopped. Also, the valves 243d to 243f are opened, and $N_2$ gas is supplied as an inert gas from each of the first inert gas supply pipe 232d, second inert gas supply pipe 232e, and third inert gas supply pipe 232f into the processing chamber 201, and exhausted from the exhaust pipe 231. The $N_2$ gas acts as a purge gas, and thus, the inside of the processing chamber 201 is purged with the inert gas, and a gas or a byproduct left in the processing chamber 201 is removed from the processing chamber 201 (purge). Subsequently, the atmosphere inside of the processing chamber 201 is replaced with the inert gas, and a pressure inside of the processing chamber 201 returns to a normal pressure (return to the atmospheric pressure).

<Boat Unload>

Subsequently, the seal cap 219 is dropped by the boat elevator 115, and thus, an empty boat 217 on which the wafer 200 is not mounted is unloaded from the lower end of the manifold 209 to the outside of the reaction tube 203 (unload of boat). After the boat 217 is unloaded, the shutter 219s is moved by the shutter opening/closing unit 115s, and thus, the lower end opening of the manifold 209 is sealed (closing of shutter) by the shutter 219s through the O ring 220c.

(3) Effects According to the Embodiment

According to the embodiment, the following effects may be obtained.

According to the embodiment, after the boat 217 is unloaded, when the wafer 200 is not disposed in the processing chamber 201, $O_2$ gas and $H_2$ gas are supplied into the heated processing chamber 201 under a pressure less than the atmospheric pressure (modification treatment of deposition film). Therefore, a reaction byproduct forming the deposition film 100b is oxidized and is low in content of impurities such as chlorine (Cl), and thus is changed (modified) to a stable material. Furthermore, the deposition film 100b formed in the processing chamber 201 is modified to a film which has a strong boding force in a structure thereof and high density, namely, a strong film difficult to exfoliate. As a result, the production of the foreign materials 100p caused by the exfoliating of deposition film 100b can be prevented, the quality of a semiconductor device can be enhanced, and a yield rate can be improved. Also, the frequency of cleaning inside of the processing chamber 201 can be reduced, thus enhancing the productivity of the substrate processing apparatus.

Moreover, according to the embodiment, in modifying the deposition film, a temperature inside the processing chamber 201 may be set as a temperature, in which the $O_2$ gas and the $H_2$ gas react to generate an oxidative species in the processing chamber 201. And specifically, it may be set as a temperature in which an oxidative species not containing water ($H_2O$) but containing oxygen such as atomic oxygen (O) is generated in the processing chamber 201. By using the oxidative species, a reaction byproduct forming the deposition film 100b is low in content of impurities such as chlorine (Cl), and thus is changed (modified) to a very stable material. As a result, the deposition film 100b formed in the processing chamber 201 is modified to a film that has a strong bonding force in a structure thereof and high density, namely, a strong film difficult to exfoliate. Accordingly, the production of the foreign materials 100p caused by the exfoliating of deposition film 100b can be better prevented, the quality of a semiconductor device can be enhanced, and a yield rate can be improved. Also, the frequency of cleaning inside of the processing chamber 201 can be more reduced, thus more enhancing the productivity of the substrate processing apparatus.

Furthermore, according to the embodiment, by separating impurities such as chlorine (Cl) from the reaction byproduct forming the deposition film 100b, a chlorine-containing gas generated from the deposition film 100b can be prevented. Accordingly, a maintenance worker or an operator can stably perform work.

Also, according to the embodiment, by separating impurities such as chlorine (Cl) from the reaction byproduct forming the deposition film 100b, the reaction byproduct having active (oxidative) properties can be modified to a stable material. As a result, damages such as corrosion caused to the metal members such as the manifold 209, the seal cap 219, and the rotation axis 255 can be prevented, and therefore, the frequency of maintenance of the substrate processing apparatus can decrease, thus enhancing productivity. Also, foreign materials produced from a metal member can be prevented, thus enhancing the quality of a semiconductor device.

Further, according to the embodiment, a process that supplies HCDS gas into the process container with the wafer 200 placed therein to form a silicon-containing layer on the wafer 200 and a process, which supplies the $O_2$ gas and the $H_2$ gas into the heated process container under a pressure less than an atmospheric pressure to change the silicon-containing layer to a silicon oxide layer, are alternately performed predetermined number of times (one time or more), thereby forming a silicon oxide film on the wafer 200. Accordingly, the film-thickness uniformity and step coverage of the silicon oxide film in the wafer 200 surface can be more enhanced than a case in which a silicon oxide film is formed by a general CVD process.

Moreover, according to the embodiment, the process that changes the silicon-containing layer to the silicon oxide layer reacts the $O_2$ gas with the $H_2$ gas to generate an oxidative species not containing water ($H_2O$) but containing oxygen such as atomic oxygen (O), in the heated processing chamber 201 under a pressure less than the atmospheric pressure, and changes the silicon-containing layer to the silicon oxide layer by using the oxidative species. Accordingly, there are very few impurities such as chlorine (Cl), and thus, a very good silicon oxide film can be formed.

(4) Modification Example

The above-described modification treatment illustrated in FIGS. 4 and 5 is performed in a state where the empty boat 217 is loaded into the processing chamber 201 after wafer discharge. However, modification treatment timing according to the embodiment is not limited to the aspect, and may be changed as described below.

Modification Example 1

Figure 11:
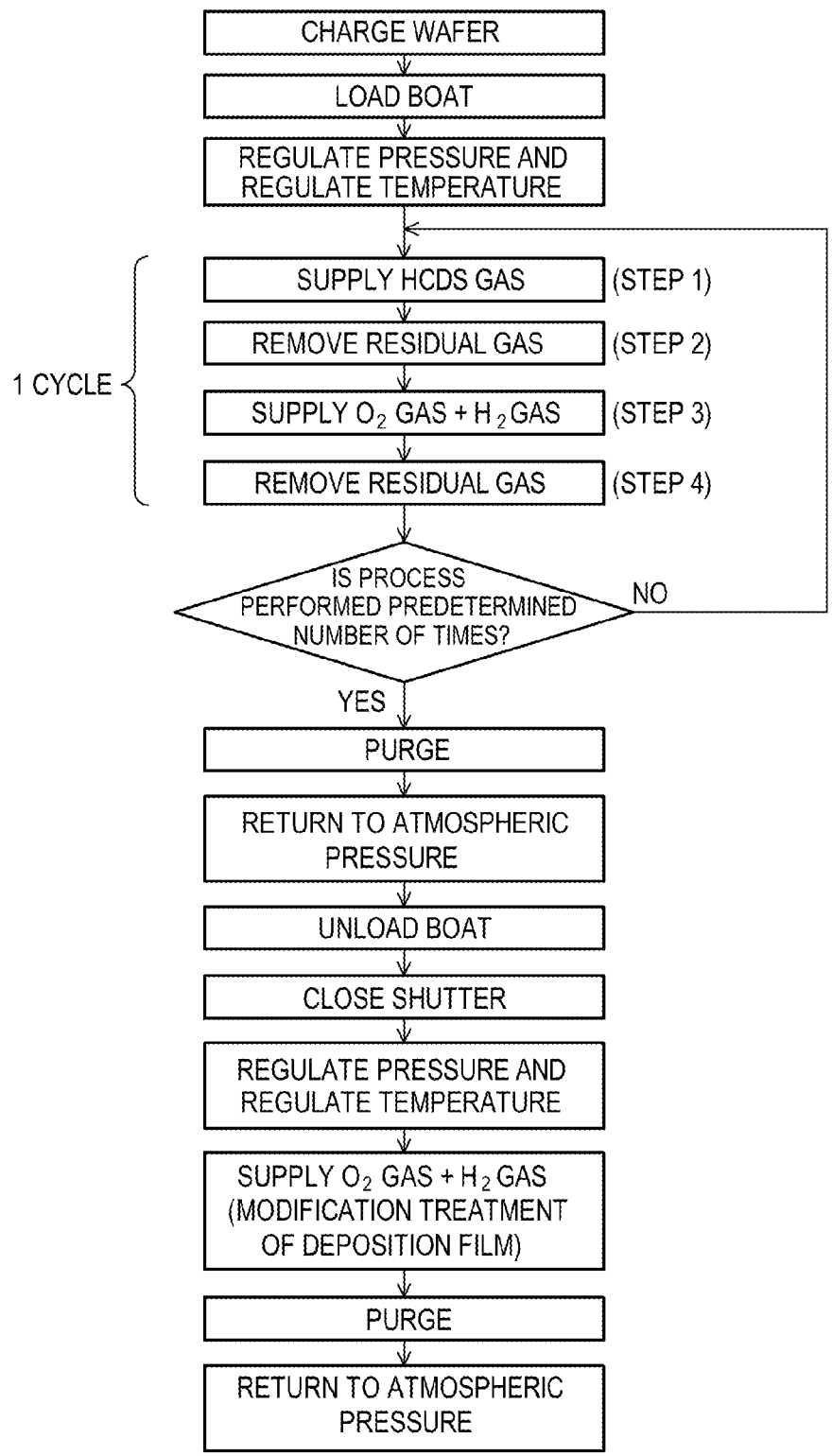
FIG. 11 is a diagram illustrating a first modification example of the processing flow in the first embodiment of the present disclosure, and is a diagram illustrating an operation in which the modification treatment of a deposition film is not performed before boat unload but is performed after boat unload while an empty boat is not loaded into the process container.
Figure 15:
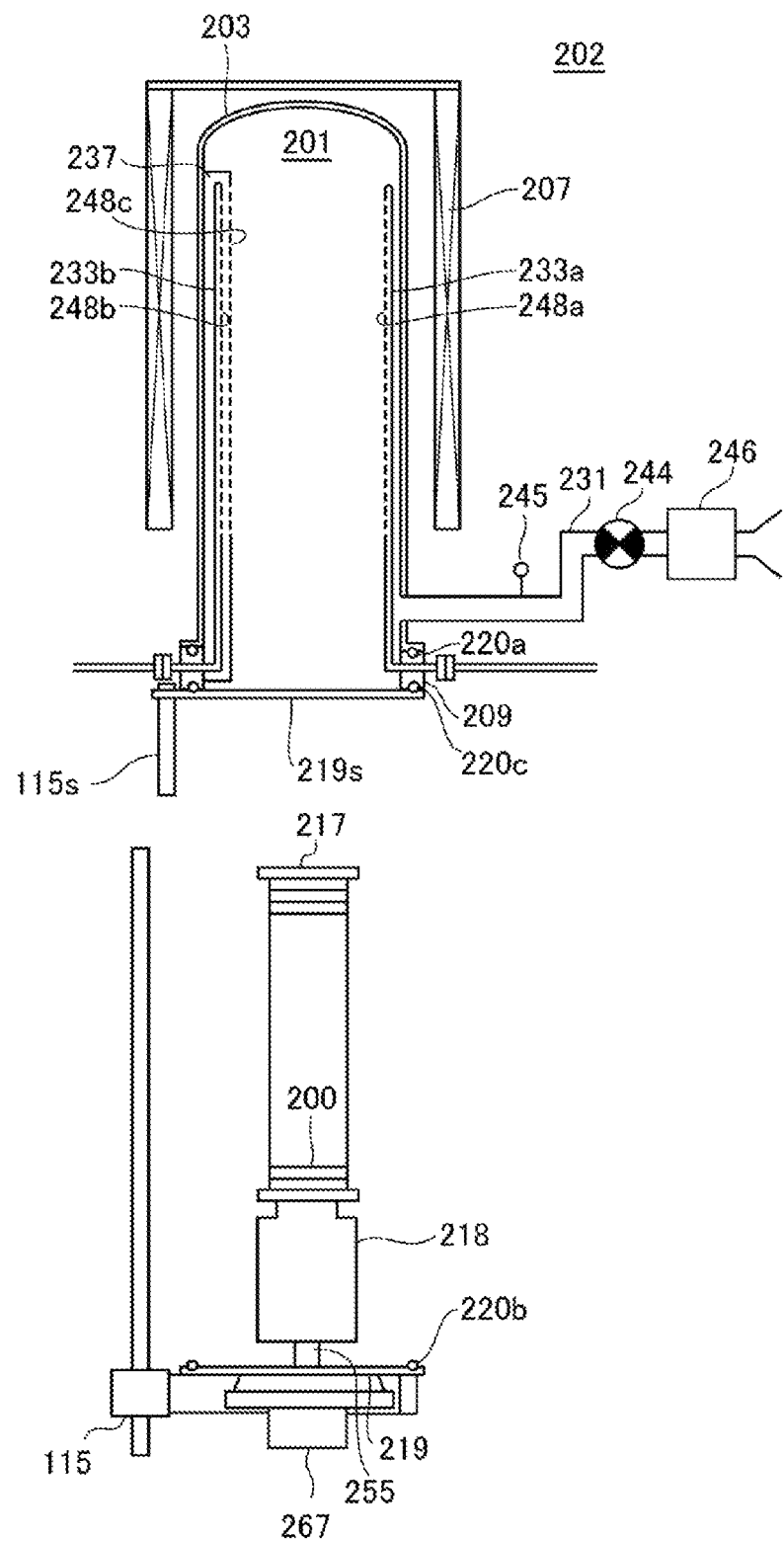
FIG. 15 is a view illustrating a state in which the vertical processing furnace has been shutter-closed without loading the boat into the process container, in the vertical processing furnace of the substrate processing apparatus, according to some embodiments, which is appropriately used in an embodiment of the present disclosure.

For example, as illustrated in FIG. 11, the modification treatment of a deposition film may be performed simultaneously with the discharge of a wafer, without standing by for the completion of the wafer discharge. In this case, the modification treatment of the deposition film is performed in a state where the empty boat 217 is not loaded into the process container after boat unload, namely, a state where the shutter 219s is moved by the shutter opening/closing unit 115s and the lower end opening of the manifold 209 is sealed (closing of shutter) by the shutter 219s through the O ring 220c. Also, FIG. 15 is a view illustrating a state in which the processing furnace 202 is closed without loading the empty boat 217 into the process container, in the processing furnace 202 of the substrate processing apparatus according to the modification example.

In this way, by performing the modification treatment of a deposition film while standing by for the completion of wafer discharge, a total time that is expended in a substrate processing process including the modification treatment of the deposition film can be shortened, thus enhancing the total efficiency of substrate processing.

Modification Example 2

Figure 12:
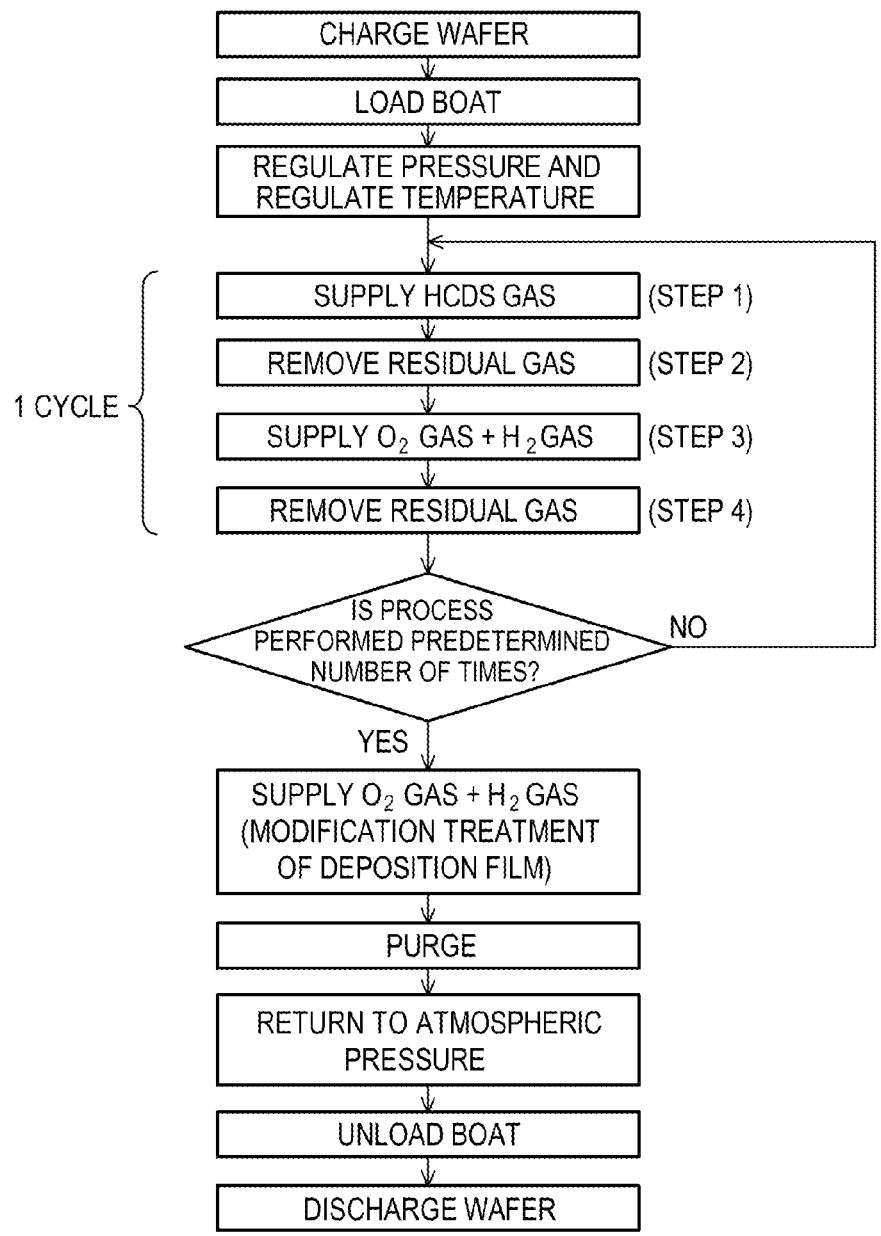
FIG. 12 is a diagram illustrating a second modification example of the processing flow in the first embodiment of the present disclosure, and is a diagram illustrating an operation in which the modification treatment of the deposition film is performed before boat unload but is not performed after boat unload.

Moreover, for example, as illustrated in FIG. 12, the modification treatment of the deposition film may be performed before boat unload. In this case, the cycle including the steps 1 to 4 is performed predetermined number of times, and then, the modification treatment of the deposition film is performed before purging the inside of the processing chamber 201 or returning to a pressure inside of the processing chamber 201 to the atmospheric pressure. In this case, a sequence and processing condition is approximately similar to the modification treatment of the deposition film that has been described above with reference to FIGS. 4 and 5. However, the temperature of the heater 207 is set as a temperature in which a temperature inside of the processing chamber 201 becomes equal to a temperature inside of the processing chamber 201 which has been already set in the above-described process of forming the silicon oxide film, and for example, may be set as a temperature within a range of 450 to 800 degrees C., and specifically, a range of 550 to 750 degrees C. Also, for example, a time taken in supplying $O_2$ gas and the $H_2$ gas into the processing chamber 201 may be set as a time within a range of 10 to 30 min.

In this way, if the modification treatment of the deposition film is performed before boat unload, the same effects as those of the modification treatment of the deposition film described above with reference to FIGS. 4 and 5 can be obtained.

Moreover, if the modification treatment of the deposition film is performed before a boat unload, a high-quality silicon oxide film formed on the wafer 200 can be more improved in film quality. That is, since an active species generated in the processing chamber 201 is supplied to the silicon oxide film (formed on the wafer 200) as well as the deposition film 100b, the in-film impurities can be more removed from the high-quality silicon oxide film, thus more improving film quality.

Second Embodiment of Present Disclosure

As described above, by performing the modification treatment of the deposition film before boat unload, while a thin film-formed substrate has been accommodated in the process container, a thin film formed on the substrate and a byproduct adhered to the inside of the process container may be modified.

In this case, however, when the byproduct adhered to the inside of the process container is modified, a film-forming base (substrate surface) may be oxidized. Especially, if the thin film formed on the substrate is relatively thin, the film-forming base is easily oxidized. Also, if a processing temperature for modification treatment performed before boat unload is excessively high (i.e., oxidizing power is excessively strong) or a processing time of modification treatment is excessively long, the film-forming base is easily oxidized. Accordingly, modification treatment performed before boat unload needs to be performed under a processing condition in which the film-forming base is difficult to oxidize, and for example, a processing condition described in the modification example 2 of the first embodiment. However, by performing only modification treatment under the above-described condition, the modification effect of the byproduct can become insufficient.

Figure 13:
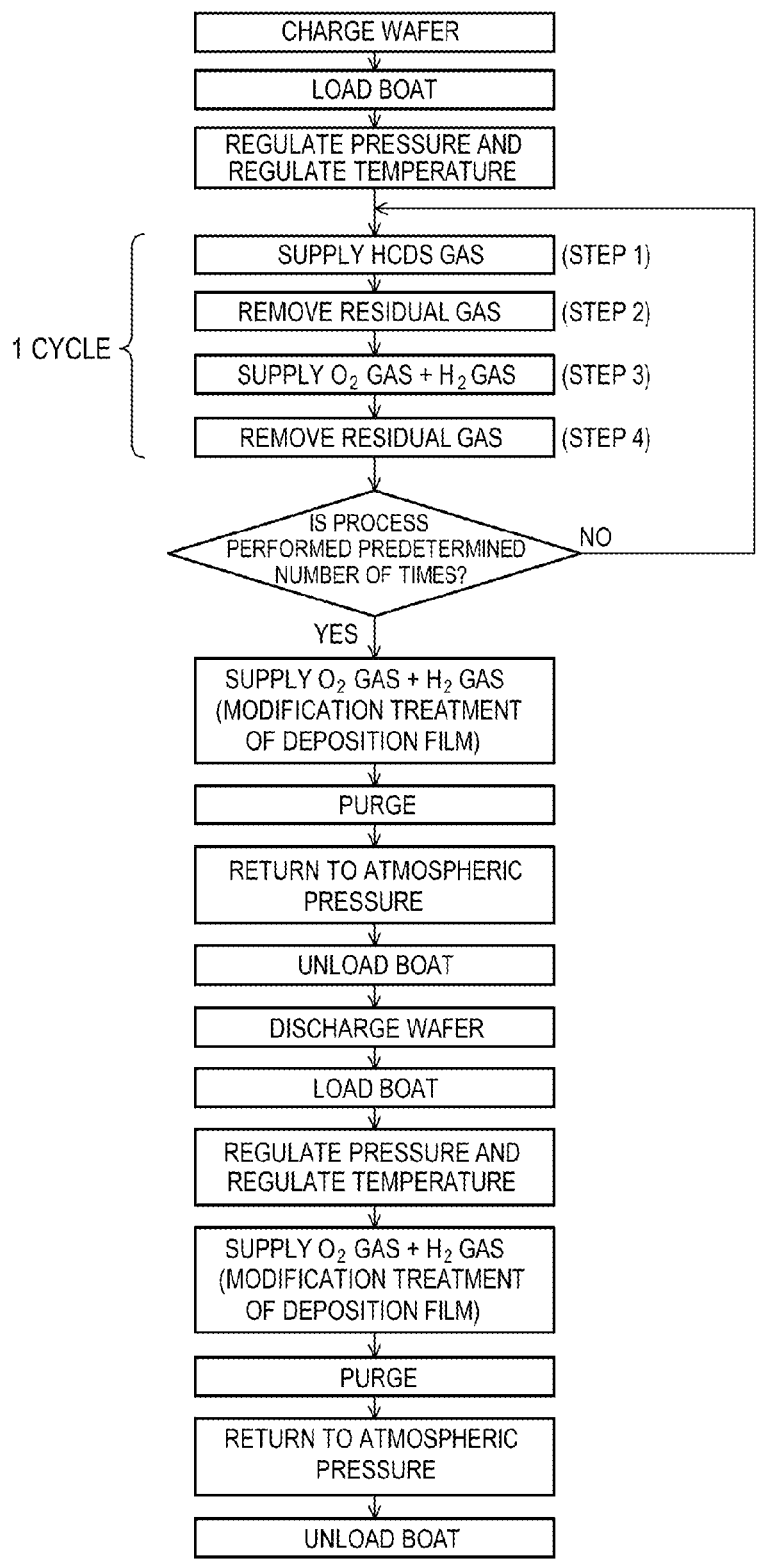
FIG. 13 is a diagram illustrating an example of a processing flow in a second embodiment of the present disclosure, and is a diagram illustrating an operation in which the modification treatment of the deposition film is performed before boat unload, and also performed after boat unload while the empty boat has been loaded into the process container.
Figure 14:
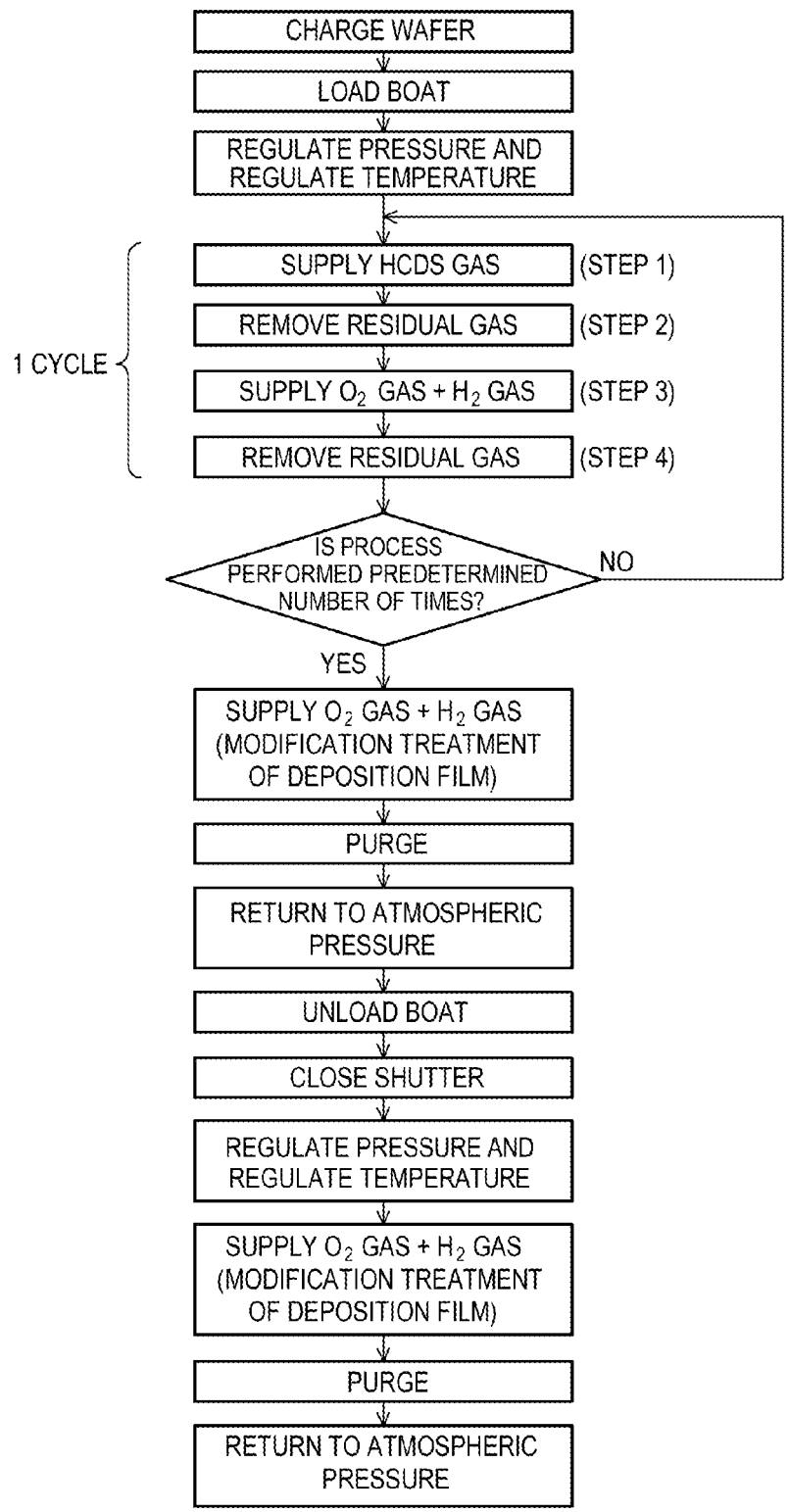
FIG. 14 is a diagram illustrating an example of a processing flow in the second embodiment of the present disclosure, and is a diagram illustrating an operation in which the modification treatment of the deposition film is performed before boat unload, and also performed after boat unload while the empty boat is not loaded into the process container.

For this reason, in the embodiment, to overcome the limitations, as illustrated in FIGS. 13 and 14, the modification treatment of the deposition film is performed both before and after boat unload.

That is, in the embodiment, processes are sequentially performed, which include carrying a substrate into the process container, forming a thin film on the substrate by supplying a source gas containing a certain element and a halogen element into the process container with the substrate accommodated therein, performing a first modification treatment to a byproduct adhered to the inside of the process container by supplying an oxygen-containing gas and a hydrogen-containing gas into the heated process container under a pressure less than an atmospheric pressure when the thin film-formed substrate has been accommodated in the process container, that carrying the thin film-formed substrate out of the process container, and performing a second modification treatment to the byproduct adhered to the inside of the process container after the first modification treatment by supplying an oxygen-containing gas and a hydrogen-containing gas into the heated process container under the pressure less than the atmospheric pressure when the substrate is not disposed in the process container.

In this way, in the embodiment, the first modification treatment is performed before boat unload, and the second modification treatment is performed after boat unload. Also, FIG. 13 is a diagram illustrating a processing flow in which the first modification treatment is performed before boat unload, and also the second modification treatment is performed after boat unload when the empty boat 217 has been loaded into the process container. FIG. 14 is a diagram illustrating a processing flow in which the first modification treatment is performed before boat unload, and also the second modification treatment is performed after boat unload when the empty boat 217 is not loaded into the process container, namely, the processing furnace 202 has been shutter-closed.

Moreover, all sequences of the first modification treatment illustrated in FIGS. 13 and 14 are approximately similar to that of the modification treatment of the deposition film in the modification example 2 of the first embodiment which has been described above with reference to FIG. 12.

Also, a sequence of the second modification treatment illustrated in FIG. 13 is approximately similar to that of the modification treatment of the deposition film in the first embodiment which has been described above with reference to FIGS. 4 and 5. Also, a sequence of the second modification treatment illustrated in FIG. 14 is approximately similar to that of the modification treatment of the deposition film in the modification example 1 of the first embodiment which has been described above with reference to FIG. 11.

However, the first modification treatment may be performed in a processing condition in which the film-forming base is difficult to oxidize, and for example, a processing condition disclosed in the above-described modification example 2 of the first embodiment.

Specifically, in the first modification treatment, the temperature of the heater 207 may be set so that a temperature inside of the processing chamber 201 becomes equal to a temperature inside of the processing chamber 201 which has been already set in the above-described process of forming the silicon oxide film, and for example, may be set within a range of 450 to 800 degrees C., and specifically, a range of 550 to 750 degrees C. Also, for example, a time taken in supplying $O_2$ gas and the $H_2$ gas into the processing chamber 201 may be set as a time within a range of 5 to 10 min.

Moreover, a treatment condition in the first modification treatment may differ from a treatment condition in the second modification treatment.

For example, a treatment temperature in the second modification treatment may be higher than that of the first modification treatment. Also, for example, the treatment temperature in the second modification treatment may be higher than that of the first modification treatment, and the treatment temperature in the first modification treatment may be equal to that of forming a thin film on a substrate. Also, for example, the treatment temperature in the second modification treatment may be higher than that of the first modification treatment, and the treatment temperature in the first modification treatment may be higher than that of forming the thin film on the substrate. Also, for example, a treatment time in the second modification treatment may be longer than that of the first modification treatment.

Specifically, in the second modification treatment, the temperature of the heater 207 may be set so that a temperature inside the processing chamber 201 becomes equal to a temperature inside the processing chamber 201 which has been already set in the above-described process of forming the silicon oxide film, namely, for example, a temperature within a range of 450 to 800 degrees C. and specifically 550 to 750 degrees C. Moreover, the temperature inside of the processing chamber 201 becomes equal to a temperature higher than the preceding temperatures, and for example, a temperature within a range of 450 to 900 degrees C. and specifically 600 to 800 degrees C. Also, for example, a time in supplying $O_2$ gas and the $H_2$ gas into the processing chamber 201 may be set within a range of 20 to 120 min, specifically 20 to 60 min, and more specifically 10 to 30 min.

Even in the embodiment, effects similar to those of the above described first embodiment can be obtained.

That is, by performing the first modification treatment before boat unload and performing the second modification treatment after boat unload, a reaction byproduct forming the deposition film 100b is oxidized, and the content of impurities such as chlorine (Cl) is low, thereby changing (modifying) the deposition film 100b to a stable material. Furthermore, the deposition film 100b formed in the processing chamber 201 is modified to a film which has a strong boding force in a structure thereof and high density, namely, a strong film difficult to exfoliate. As a result, the production of the foreign materials 100p caused by the exfoliating of deposition film 100b can be prevented, the quality of a semiconductor device can be enhanced, and a yield rate can be improved. Also, the frequency of cleaning inside of the processing chamber 201 can be reduced, thus enhancing the productivity of the substrate processing apparatus.

Moreover, by separating impurities such as chlorine (Cl) from the reaction byproduct forming the deposition film 100b, a chlorine-containing gas generated from the deposition film 100b can be prevented. Accordingly, a maintenance worker or an operator can stably perform work.

Furthermore, by separating impurities such as chlorine (Cl) from the reaction byproduct forming the deposition film 100b, the reaction byproduct having active (oxidative) properties can be modified to a stable material. As a result, damages such as corrosion caused to the metal members inside of the processing chamber 201 can be prevented. Therefore, the frequency of maintenance of the substrate processing apparatus can decrease, thus enhancing productivity. Also, foreign materials produced from a metal member can be prevented, thus enhancing the quality of a semiconductor device.

Moreover, by performing the first modification treatment before boat unload, the quality of the high-quality silicon oxide film formed on the wafer 200 can be more improved.

Furthermore, in an embodiment where the modification treatment of the deposition film is performed both before and after boat unload, the above-described effects can be more enhanced than the first embodiment in which the modification treatment of the deposition film is performed only before or after boat unload.

The first modification treatment performed before boat unload, as described above, needs to be performed in a processing condition in which the film-forming base is difficult to oxidize. Therefore, by modifying a byproduct through only the first modification treatment, the modification effect of the byproduct can be insufficient. For this reason, by performing the second modification treatment after boat unload, the insufficient modification effect of the first modification treatment can be complemented. Since the second modification treatment is performed when the wafer 200 is not disposed in the process container, it does not have the limitations of the first modification treatment. Moreover, it is possible to increase a processing temperature higher or extend a processing time in the second modification treatment longer than the first modification treatment. That is, a treatment condition in the first modification treatment may differ from that of the second modification treatment. Therefore, by raising (increasing oxidizing power) the treatment temperature in the second modification treatment higher than that of the first modification treatment, or by extending the treatment time in the second modification treatment longer than that of the first modification treatment, the insufficient modification effect of the first modification treatment can be complemented sufficiently and efficiently.

Moreover, if trying to modify the byproduct through only the first modification treatment or only the second modification treatment, much time can be unnecessarily expended in modifying the byproduct. To overcome such a limitation, by performing the second modification treatment after performing the first modification treatment, the time necessary for modifying the byproduct can be shortened. That is, by differently setting the treatment conditions in the first modification treatment and the second modification treatment, and by raising (increasing oxidizing power) the treatment temperature in the second modification treatment higher than that of the first modification treatment, the time necessary for the second modification treatment, namely, a total time necessary for modifying the byproduct can be shortened, thus enhancing a throughput in total.

Furthermore, the second modification treatment is performed after boat unload, namely, in a state where the thin film-formed wafer 200 is not accommodated in the process container. For this reason, modifying the byproduct through only the second modification treatment makes it very difficult to modify the thin film formed on the wafer 200. To overcome such a limitation, by performing the second modification treatment after boat unload, and moreover by performing the first modification treatment before boat unload, similarly to the second modification example of the first embodiment, the quality of the thin film formed on the wafer 200 can be more improved.

In this way, by performing the second modification treatment after boat unload, and moreover by performing the first modification treatment before boat unload, the oxidization of the film-forming base can be suppressed, and the thin film formed on the wafer 200 and the byproduct adhered to the inside of the process container can be modified sufficiently and efficiently. Also, a throughput can be enhanced in total.

Moreover, when the treatment temperature in the first modification treatment is equal to a process temperature of forming the thin film on the wafer 200, it becomes easier to enhance a throughput in total. This is because, between the process of forming the thin film on the wafer 200 and the process of performing the first modification treatment, by changing a temperature [temperature of the heater 207] inside of the processing chamber 201, it is not required to stand by until a temperature is stabilized.

Furthermore, even when the treatment temperature in the first modification treatment is equal to a process temperature of forming the thin film on the wafer 200, it becomes far easier to enhance a throughput in total. This is because, by setting the treatment temperature as described above, oxidizing power in the first modification treatment can increase, and the time necessary for the first modification treatment can be shortened. Even in this case, however, oxidizing power should not be excessively strong, and it is required to set a condition in which the film-forming base is difficult to oxidize.

Another Embodiment of Present Disclosure

The present disclosure has been described with reference to some aspects and embodiments, but the present disclosure is not limited to the above-described aspects and embodiments. The present disclosure may be variously modified or changed without departing from the spirit and scope thereof as defined by the appended claims.

For example, the modification treatment of the deposition film may be performed each time processing (batch processing) of forming an SiO film on the plurality of wafers 200 is performed, or performed each time when the batch processing is performed predetermined number of times (a plurality of times).

That is, when performing batch processing that forms a SiO film having a relative thin film thickness on the wafer 200, the thickness of the deposition film 100b formed in the processing chamber 210 tends to become thinner. In this case, the modification treatment of the deposition film may not be performed each time the batch processing is performed, but may be performed after the batch processing is performed a plurality of times. In the case where the thickness of the deposition film 100b formed by performing the batch processing a plurality of times is relatively thin, as illustrated in FIGS. 4, 11 and 12, a processing flow may be selected in which the modification treatment of the deposition film is performed only before or after boat unload. Also, in the case where the thickness of the deposition film 100b which is formed by performing the batch processing a plurality of times is relatively thick, as illustrated in FIGS. 13 and 14, a processing flow may be selected in which the modification treatment of the deposition film is performed both before or after boat unload.

Moreover, in the case where performing batch processing that forms a SiO film having a relative thick film thickness on the wafer 200, the thickness of the deposition film 100b formed in the processing chamber 210 tends to become thicker. In this case, the modification treatment of the deposition film may be performed each time the batch processing is performed. In the case where the thickness of the deposition film 100b which is formed by performing the batch processing once is relatively thick, as illustrated in FIGS. 13 and 14, a processing flow may be selected in which the modification treatment of the deposition film is performed both before or after boat unload.

In this way, the timing for modifying a deposition film may be appropriately adjusted according to details of batch processing. Also, the processing flows respectively illustrated in FIGS. 4, 11, 12, 13 and 14 may be appropriately adjusted according to details of batch processing. The timing for modifying the deposition film and the processing flows respectively illustrated in FIGS. 4, 11, 12, 13 and 14 may be used in appropriate and free combination. That is, a plurality of process recipes corresponding to the respective processing flows may is previously installed [previously stored in the memory device 121c] in the substrate processing apparatus by using a recording medium [external memory device 123], in which an electric communication line or a process recipe thereof is recorded. And a suitable process recipe may be appropriately selected from the installed process recipes [in order for the CPU 121a to appropriately read the suitable process recipe] according to the details of the batch processing, for example, the thickness or quality of the deposition film 100b which is formed in the processing chamber 201 every one-time batch processing.

Figure 10:
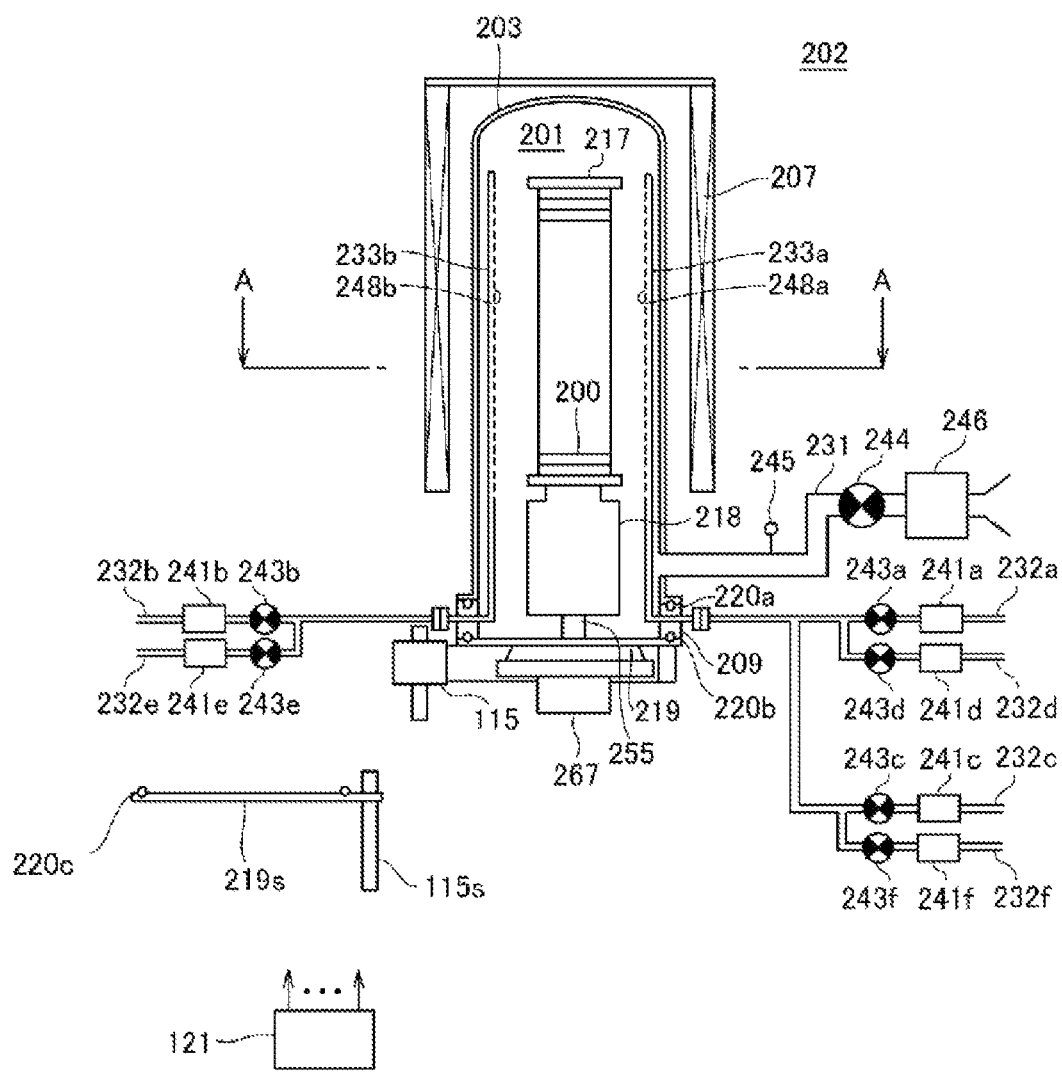
FIG. 10 is a view schematically illustrating a vertical processing furnace of a substrate processing apparatus which is appropriately used in another embodiment of the present disclosure, and is a vertical sectional view of the processing furnace.

Moreover, in the above-described embodiment, an example using the substrate processing apparatus including a plasma source or the buffer chamber 237 has been described above, but the present disclosure is not limited to this aspect. That is, as illustrated in FIG. 10, the plasma source or the buffer chamber 237 may not be provided. Through such a configuration, the structure of the substrate processing apparatus can be simplified, thus decreasing the manufacturing cost. Also, in the above-described embodiment, $O_2$ gas and $H_2$ gas are supplied from the same nozzle into the processing chamber 201, but, as illustrated in FIG. 10, HCDS gas and $H_2$ gas may be supplied from the same nozzle into the processing chamber 201. In this case, a front end portion of the third gas supply pipe 232c may be connected to a downstream side lower in position than the valve 243a of the first gas supply pipe 232a.

Furthermore, for example, in the above-described embodiment, when forming the silicon-containing layer in the step 1, an example using the chlorosilane-based source gas as the source gas has been described above, but, instead of the chlorosilane-based source gas, a silane-based source gas having halogen-based ligand other than a chloro group may be used. For example, instead of the chlorosilane-based source gas, fluorosilane-based source gas may be used. Here, the fluorosilane-based source gas is a gas which is obtained by vaporizing a gaseous fluorosilane-based source, and for example, a fluorosilane-based source having a liquid state under a normal temperature and a normal pressure, or is a fluorosilane-based source having a gaseous state under the normal temperature and the normal pressure. Also, the fluorosilane-based source is a silane-based source having a fluoro group as a halogen group, and is a source at least containing silicon (Si) and fluorine (F). That is, the fluorosilane-based source described herein may be a type of halide. The fluorosilane-based source, for example, may use tetrafluorosilane, namely, silicon fluoride gas such as silicontetrafluoride ($SiF_4$) gas or hexafluorodisilane ($Si_2F_6$) gas. In this case, when forming a silicon-containing layer, the fluorosilane-based source gas is supplied to the wafer 200 inside of the processing chamber 201. The silicon-containing layer, formed in this way, may include an adsorption layer of silicon fluoride gas, include a Si layer, or include both the adsorption layer of silicon fluoride gas and the Si layer.

Moreover, in the above-described embodiment, an example has been described above in which the same kind of oxygen-containing gas ($O_2$ gas) is used in the process of forming the silicon oxide film and the process of modifying the deposition film, but, a different kind of gas may be used when the different kind gas is the above-described oxygen-containing gas. Also, in the above-described embodiment, an example has been described above in which the same kind of hydrogen-containing gas ($H_2$ gas) is used in the process of forming the silicon oxide film and the process of modifying the deposition film, but, a different kind of gas may be used when the different kind gas is the above-described hydrogen-containing gas.

Furthermore, in the above-described embodiment, in the step 3 of forming the silicon oxide film, an example has been described above, in which the silicon-containing layer is changed to the silicon oxide layer by supplying $O_2$ gas and $H_2$ gas into the heated processing chamber 201 under a pressure less than the atmospheric pressure, but the present disclosure is not to the embodiment. That is, in the step 3 in the process of forming the silicon oxide film, an oxygen-containing gas such as $O_2$ gas, $O_3$ gas, or $H_2O$ gas may be separately supplied without supplying $H_2$ gas. Also, each of the oxygen-containing gases may be activated to become plasma and supplied.

Moreover, in the above-described embodiment, an example has been described above in which HCDS gas, $O_2$ gas, and $H_2$ gas are alternately supplied into the processing chamber 201 and the silicon oxide film is formed on the wafer 200, but the present disclosure is not to the embodiment. That is, HCDS gas and an oxygen-containing gas such as $O_2$ gas, $O_3$ gas, or $H_2O$ may be simultaneously supplied into the processing chamber 201, and the silicon oxide film may be formed on the wafer 200.

Furthermore, in the above-described embodiment, an example which forms a silicon-based thin film containing silicon (which is a semiconductor element) as a thin film has been described above, but the present disclosure is not limited thereto. That is, the present disclosure may also be appropriately applied to a case which forms a metal-based thin film containing metal elements such as titanium (Ti), zirconium (Zr), hafnium (Hf), tantalum (Ta), aluminum (Al), and molybdenum (Mo).

For example, if a titanium oxide film (TiO film) is formed as a metal-based thin film containing Ti, a source gas may use a gas containing a Ti and chloro group such as titaniumtetrachloride ($TiCl_4$), or a gas containing a Ti and fluoro group such as titaniumtetrafluoride ($TiF_4$). Gases similar to the above-described embodiment may be used as an oxygen-containing gas and a hydrogen-containing gas. In this case, also, a processing condition may use a processing condition similar to the above-described embodiment as an example.

Moreover, for example, if a zirconium oxide film (ZrO film) is formed as a metal-based thin film containing Zr, a source gas may use a gas containing a Zr and chloro group such as zirconiumtetrachloride ($ZrCl_4$), or a gas containing a Zr and fluoro group such as zirconiumtetrafluoride ($ZrF_4$). Gases similar to the above-described embodiment may be used as an oxygen-containing gas and a hydrogen-containing gas. In this case, also, a processing condition may use a processing condition similar to the above-described embodiment as an example.

Furthermore, for example, if a hafnium oxide film (HfO film) is formed as a metal-based thin film containing Hf, a source gas may use a gas containing a Hf and chloro group such as hafniumtetrachloride ($HfCl_4$), or a gas containing a Hf and fluoro group such as hafniumtetrafluoride ($HfF_4$). Gases similar to the above-described embodiment may be used as an oxygen-containing gas and a hydrogen-containing gas. In this case, also, a processing condition may use a processing condition similar to the above-described embodiment as an example.

Moreover, for example, if a tantalum oxide film (TaO film) is formed as a metal-based thin film containing Ta, a source gas may use a gas containing a Ta and chloro group such as tantalumpentachloride ($TaCl_5$), or a gas containing a Ta and fluoro group such as tantalumpent afluoride ($TaF_5$). Gases similar to the above-described embodiment may be used as an oxygen-containing gas and a hydrogen-containing gas. In this case, also, a processing condition may use a processing condition similar to the above-described embodiment as an example.

Furthermore, for example, if an aluminum oxide film (AlO film) is formed as a metal-based thin film containing Al, a source gas may use a gas containing a Al and chloro group such as aluminumtrichloride ($AlCl_3$), or a gas containing an Al and fluoro group such as aluminumtrifluoride ($AlF_3$). Gases similar to the above-described embodiment may be used as an oxygen-containing gas and a hydrogen-containing gas. In this case, also, a processing condition may use a processing condition similar to the above-described embodiment as an example.

Moreover, for example, if an molybdenum oxide film (MoO film) is formed as a metal-based thin film containing Mo, a source gas may use a gas containing a Mo and chloro group such as molybdenumpentachloride ($MoCl_5$), or a gas containing a Mo and fluoro group such as molybdenumpentafluoride ($MoF_5$). Gases similar to the above-described embodiment may be used as an oxygen-containing gas and a hydrogen-containing gas. In this case, also, a processing condition may use a processing condition similar to the above-described embodiment as an example.

As described above, the various aspects of the present disclosure may be applied to the formation of a metal-based thin film as well as a silicon-based thin film, even in which case the operational effects similar to the above-described embodiment are obtained. That is, the present disclosure may also be appropriately applied to a case of forming a thin film containing a certain element such as a semiconductor element or a metal element.

Furthermore, in the above-described embodiment, an example has been described above, in which a thin film may be formed using a batch type substrate processing apparatus that processes a plurality of substrates at one time, but the present disclosure is not limited thereto. As another example, the present disclosure may also be appropriately applied to a case in which a thin film is formed using a single-wafer substrate processing apparatus that processes one or several substrate(s) at one time. Also, in the above-described embodiment, an example has been described above, in which a thin film is formed using a substrate processing apparatus including a hot wall type processing furnace, but the present disclosure is not limited thereto. As another example, one or more aspects of the present disclosure may also be appropriately applied to a substrate processing apparatus including a cold wall type processing furnace.

Moreover, the above-described embodiments, modification examples, and application examples may be used in appropriate combination.

Furthermore, for example, various embodiments of the present disclosure may be realized by replacing the process recipe of the existing substrate processing apparatus. In changing a process recipe, a process recipe according to the present disclosure may be installed in the existing substrate processing apparatus by using a recording medium, in which an electric communication line or a process recipe thereof is recorded, the existing process recipe may be replaced by manipulating the input/output device of the existing substrate processing apparatus, or a corresponding process recipe itself may be replaced by the process recipe according to the present disclosure.

Example

First, in a comparative example, processing (batch processing) that forms a SiO film on a plurality of wafers has been performed a plurality of times in the film-forming sequence of the above-described embodiment by using the substrate processing apparatus in the above-described embodiment. In the comparative example, modification treatment of a deposition film is not performed. HCDS gas has been used as a source gas, $O_2$ gas has been used as an oxygen-containing gas, and $H_2$ gas has been used as a hydrogen-containing gas. A film-forming processing condition (processing condition in each step) has been set as a condition within a processing condition range described in the above-described embodiment. Furthermore, the number of foreign materials adhered to a wafer has been measured each time the batch processing is completed.

Next, in an example, processing (batch processing) that forms a SiO film on a plurality of wafers and then modifies a deposition film formed in a processing chamber has been performed a plurality of times in the film-forming sequence and deposition film modification sequence of the above-described embodiment. After the batch processing in the comparative example has been performed a plurality of times, the batch processing in the example has been performed a plurality of times in the same processing chamber by using the same substrate processing apparatus. Also, when processed details are switched from the batch processing of the comparative example to the batch processing of the example, cleaning inside of the processing chamber is not performed. In film-forming processing, HCDS gas has been used as a source gas, $O_2$ gas has been used as an oxygen-containing gas, and $H_2$ gas has been used as a hydrogen-containing gas. In the modification treatment of the deposition film, $O_2$ gas has been used as an oxygen-containing gas, and $H_2$ gas has been used as a hydrogen-containing gas. A film-forming processing condition (processing condition in each step) and the modification treatment condition of the deposition film have been set as conditions within a processing condition range described in the above-described embodiment. Furthermore, the number of foreign materials adhered to a wafer has been measured each time the film-forming processing is completed.

Figure 9:
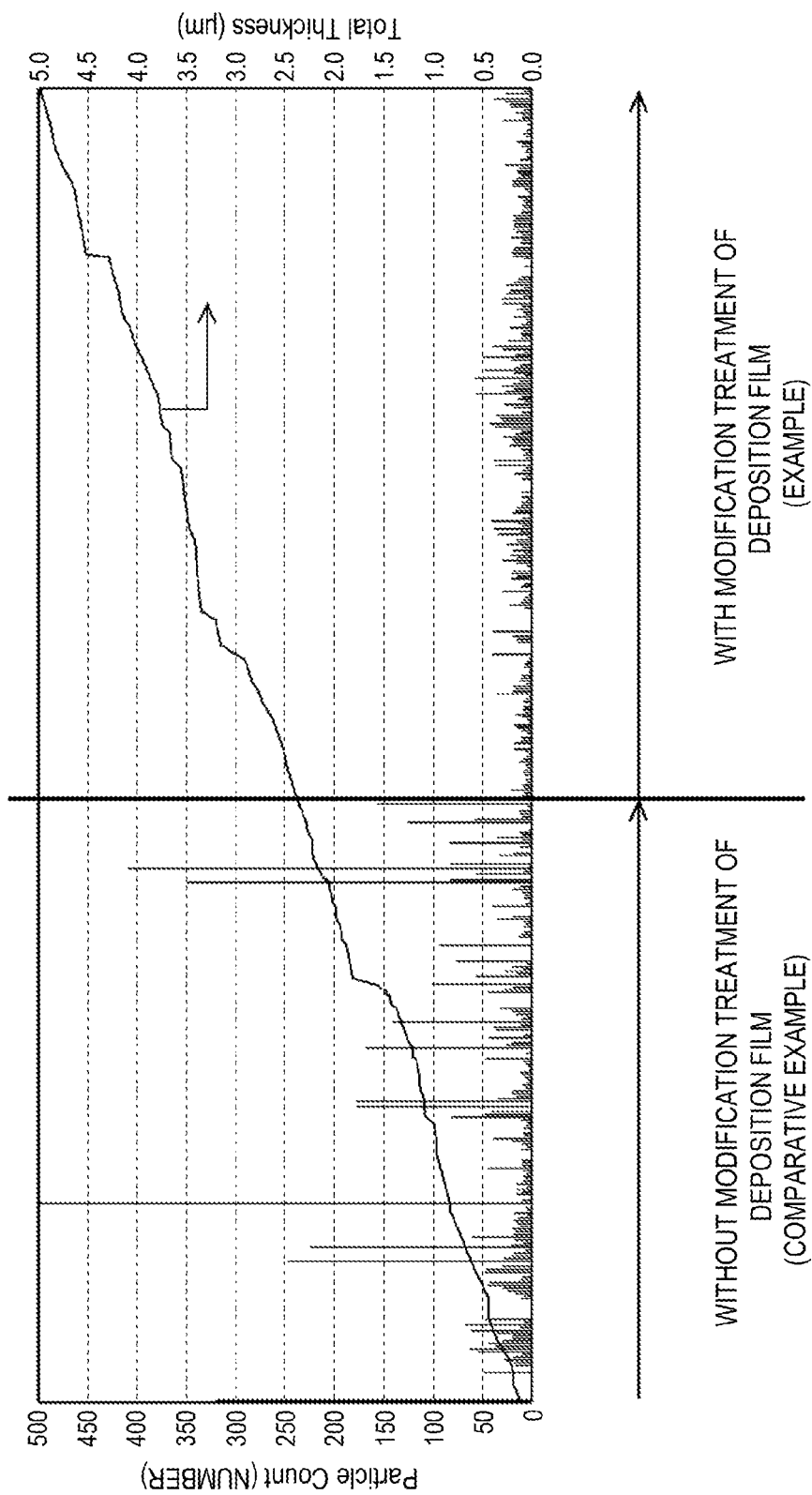
FIG. 9 is a graphical illustration of evaluation results in an example and comparative example of the present disclosure.

FIG. 9 is a view for describing evaluation results in the example and comparative example of the present disclosure. The abscissa axis of FIG. 9 indicates the number of batch processings, the left ordinate axis of FIG. 9 indicates the number of foreign materials detected from on a wafer, and the right ordinate axis of FIG. 9 indicates the deposition-film thickness of a SiO film formed in a process container. According to FIG. 9, it can be seen that a number of foreign materials are adhered to the wafer in the comparative example in which the modification treatment of a deposition film is not performed, but, in the example, although a deposition-film thickness inside the processing chamber increases, the adhesion of foreign materials to the wafer is greatly suppressed. Also, in the example, it can be seen that even when a deposition-film thickness reaches 5 μm, the production of foreign materials is suppressed, and thus, the deposition film formed in the processing chamber is modified to a strong film difficult to exfoliate.

<Aspects of Present Disclosure>

Hereinafter, the preferred additional aspects of the present disclosure will be additionally stated.

(Supplementary Note 1)

According to one aspect of the present disclosure, there is provided a method of manufacturing a semiconductor device which include: carrying a substrate into a process container; forming a thin film on the substrate by supplying a source gas containing a certain element and a halogen element into the process container with the substrate accommodated therein; performing a first modification treatment to a byproduct adhered to an inside of the process container by supplying an oxygen-containing gas and a hydrogen-containing gas into the heated process container under a pressure less than an atmospheric pressure, when the thin film-formed substrate has been accommodated in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, when the substrate is not accommodated in the process container.

(Supplementary Note 2)

In the method according to the aspect of the present disclosure described in the supplementary note 1, a treatment condition in the performing of the first modification treatment may differ from a treatment condition in the performing of the second modification treatment.

(Supplementary Note 3)

In the method according to the aspect described in the supplementary note 1 or 2, a treatment time in the performing of the second modification treatment may be longer than a treatment time in the performing of the first modification treatment.

(Supplementary Note 4)

In the method according to one of the aspects described in the supplementary notes 1 to 3, a treatment temperature in the performing of the second modification treatment may be higher than a treatment temperature in the performing of the first modification treatment.

(Supplementary Note 5)

In the method according to one of the aspects described in the supplementary notes 1 to 4, a treatment temperature in the performing of the second modification treatment may be higher than a treatment temperature in the performing of the first modification treatment, and the treatment temperature in the performing of the first modification treatment may be equal to a treatment temperature in the forming of the thin film on the substrate.

(Supplementary Note 6)

In the method according to one of the aspects described in the supplementary notes 1 to 4, a treatment temperature in the performing of the second modification treatment may be higher than a treatment temperature in the performing of the first modification treatment, and the treatment temperature in the performing of the first modification treatment may be higher than a treatment temperature in the forming of the thin film on the substrate.

(Supplementary Note 7)

In the method according to one of the aspects described in the supplementary notes 1 to 6, the process of forming of the thin film on the substrate may include: forming a certain element-containing layer by supplying the source gas into the process container; changing the certain element-containing layer to an oxide layer by supplying an oxygen-containing gas and a hydrogen-containing gas into the heated process container under the pressure less than the atmospheric pressure; and forming an oxide film on the substrate by alternately performing a certain number of times the forming of the certain element-containing layer and the changing of the certain element-containing layer to the oxide layer.

(Supplementary Note 8)

In the method according to one of the aspects described in the supplementary notes 1 to 7, each of the process of performing of the first modification treatment and the process of performing of the second modification treatment may include: reacting the oxygen-containing gas with the hydrogen-containing gas to generate an oxidative species, in the heated process container under the pressure less than the atmospheric pressure; and performing modification treatment to the byproduct by using the oxidative species.

(Supplementary Note 9)

In the method according to the aspect described in the supplementary note 7 or 8, the process of changing of the certain element-containing layer to the oxide layer may include: react the oxygen-containing gas with the hydrogen-containing gas to generate an oxidative species, in the heated process container under the pressure less than the atmospheric pressure; and changing the certain element-containing layer to the oxidative layer by using the oxidative species.

(Supplementary Note 10)

In the method according to the aspect described in the supplementary note 8 or 9, the oxidative species may include oxygen not containing $H_2O$.

(Supplementary Note 11)

In the method according to the aspect described in the supplementary note 8 or 9, the oxidative species may be atomic oxygen.

(Supplementary Note 12)

In the method according to one of the aspects described in the supplementary notes 1 to 11, the certain element may include a silicon element or a metal element, and the halogen element may include a chlorine element or a fluorine element.

(Supplementary Note 13)

According to another aspect of the present disclosure, there may be provided a method of manufacturing a semiconductor device which include: carrying a substrate into a process container; forming a certain element-containing layer by supplying a source gas containing a certain element and a halogen element into the process container with the substrate accommodated therein, changing the certain element-containing layer to an oxide layer by supplying an oxygen-containing gas and a hydrogen-containing gas into the heated process container under a pressure less than an atmospheric pressure, and forming an oxide film on the substrate by alternately performing the forming of the certain element-containing layer and the changing of the certain element-containing layer to the oxide layer a predetermined number of times; carrying the oxide film-formed substrate out of the process container; and performing modification treatment to a byproduct adhered to an inside of the process container supplying an oxygen-containing gas and a hydrogen-containing gas into the heated process container under the pressure less than the atmospheric pressure, when the substrate is not disposed in the process container.

(Supplementary Note 14)

According to still another aspect of the present disclosure, there may be provided a method of manufacturing a semiconductor device which include: carrying a support supporting a substrate into a process container; forming a certain element-containing layer by supplying a source gas containing a certain element and a halogen element into the process container with the support supporting the substrate accommodated therein, changing the certain element-containing layer to an oxide layer by supplying an oxygen-containing gas and a hydrogen-containing gas into the heated process container under a pressure less than an atmospheric pressure, and forming an oxide film on the substrate by alternately performing the forming of the certain element-containing layer and the changing of the certain element-containing layer to the oxide layer a predetermined number of times; carrying the support supporting the oxide film-formed substrate out of the process container; carrying the support into the process container; and performing modification treatment to a byproduct adhered to an inside of the process container by supplying an oxygen-containing gas and a hydrogen-containing gas into the heated process container under the pressure less than the atmospheric pressure, when the substrate is not disposed in the process container and the support is accommodated in the process container.

(Supplementary Note 15)

According to yet another aspect of the present disclosure, there may be provided a method of processing a substrate which includes: carrying a substrate into a process container; forming a thin film on the substrate by supplying a source gas into the process container with the substrate accommodated therein, the source gas containing a certain element and a halogen element; performing a first modification treatment to a byproduct adhered to an inside of the process container by supplying an oxygen-containing gas and a hydrogen-containing gas into the heated process container under a pressure less than an atmospheric pressure, when the thin film-formed substrate is accommodated in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, when the substrate is not disposed in the process container.

(Supplementary Note 16)

According to still another aspect of the present disclosure, there may be provided a substrate processing apparatus which includes: a process container configured to accommodate a substrate; a transfer unit configured to carry the substrate into and out of the process container; a source gas supply system configured to supply a source gas into the process container, the source gas containing a certain element and a halogen element; an oxygen-containing gas supply system configured to supply an oxygen-containing gas into the process container; a hydrogen-containing gas supply system configured to supply a hydrogen-containing gas into the process container; a heater configured to heat an inside of the process container; a pressure regulator configured to regulate a pressure inside the process container; and a controller configured to control the transfer unit, the source gas supply system, the oxygen-containing gas supply system, the hydrogen-containing gas supply system, the heater, and the pressure regulator so as to carry the substrate into the process container, supply the source gas into the process container with the substrate accommodated therein to form a thin film on the substrate, supply an oxygen-containing gas and a hydrogen-containing gas into the heated process container under a pressure less than an atmospheric pressure to perform a first modification treatment to a byproduct adhered to an inside of the process container, in the state of accommodating the thin film-formed substrate in the process container, carry the thin film-formed substrate out of the process container, and supply an oxygen-containing gas and a hydrogen-containing gas into the heated process container under the pressure less than the atmospheric pressure to perform a second modification treatment to the byproduct adhered to the inside of the process container after the first modification treatment, in the state of not accommodating the substrate in the process container.

(Supplementary Note 17)

According to yet another aspect of the present disclosure, there may be provided a program that causes a computer to perform a process of: carrying a substrate into a process container of a substrate processing apparatus; forming a thin film on the substrate by supplying a source gas into the process container with the substrate accommodated therein, the source gas containing a certain element and a halogen element; performing a first modification treatment to a byproduct adhered to an inside of the process container by supplying an oxygen-containing gas and a hydrogen-containing gas into the heated process container under a pressure less than an atmospheric pressure, in the state of accommodating the thin film-formed substrate in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, in the state of not accommodating the substrate in the process container.

(Supplementary Note 18)

According to still another aspect of the present disclosure, there may be provided a non-transitory computer-readable recording medium storing a program that causes a computer to perform a process of: carrying a substrate into a process container of a substrate processing apparatus; forming a thin film on the substrate supplying a source gas into the process container with the substrate accommodated therein, the source gas containing a certain element and a halogen element; performing a first modification treatment to a byproduct adhered to an inside of the process container supplying an oxygen-containing gas and a hydrogen-containing gas into the heated process container under a pressure less than an atmospheric pressure, in the state of accommodating the thin film-formed substrate in the process container; carrying the thin film-formed substrate out of the process container; and performing a second modification treatment to the byproduct adhered to the inside of the process container after the first modification treatment by supplying an oxygen-containing gas and a hydrogen-containing gas into the heated process container under the pressure less than the atmospheric pressure, in the state of not accommodating the substrate in the process container.

According to the semiconductor device manufacturing method, substrate processing method, substrate processing apparatus, and recording medium of the present disclosure, the production of foreign materials can be suppressed in a process container.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

carrying a substrate into a process container;

forming a thin film on the substrate by supplying a source gas into the process container accommodating the substrate, the source gas containing a certain element and a halogen element;

performing a first modification treatment to an adsorption layer of a residual source gas adhered to inside of the process container by simultaneously supplying a combination of gases consisting of oxygen ($O_2$) gas and hydrogen ($H_2$) gas into the heated process container under a pressure less than an atmospheric pressure, in the state of accommodating the thin film-formed substrate in the process container;

carrying the thin film-formed substrate out of the process container; and performing a second modification treatment to the modified adsorption layer adhered to the inside of the process container, which is formed by performing the first modification treatment to the adsorption layer of the residual source gas and being oxidized by a water in an atmosphere penetrated into the process container in the carrying of the thin film-formed substrate out of the process container, the second modification treatment consisting of simultaneously supplying a combination of gases consisting of oxygen ($O_2$) gas and hydrogen ($H_2$) gas into the heated process container under a pressure less than the atmospheric pressure, in the state of not accommodating the substrate in the process container, the adsorption layer being a first adsorption layer of the residual source gas to which the first modification treatment has been performed, or a second adsorption layer of the residual source gas, which is not modified by the first modification treatment, wherein the simultaneous supply of the combination of gases consisting of the oxygen ($O_2$) gas and the hydrogen ($H_2$) gas into the process container for the first and second modifications includes activating the oxygen ($O_2$) gas and the hydrogen ($H_2$) gas by heat and generating oxidative species not containing water ($H_2O$) but containing an atomic oxygen based on the activation of the oxygen ($O_2$) gas and the hydrogen ($H_2$) gas.

2. The method of claim 1, wherein a treatment time in the performing of the second modification treatment is longer than a treatment time in the performing of the first modification treatment.

3. The method of claim 1, wherein a treatment temperature in the performing of the second modification treatment is higher than a treatment temperature in the performing of the first modification treatment.

4. The method of claim 1, wherein,
a treatment temperature in the performing of the second modification treatment is higher than a treatment temperature in the performing of the first modification treatment, and
the treatment temperature in the performing of the first modification treatment is equal to a treatment temperature in the forming of the thin film on the substrate.

5. The method of claim 1, wherein,
a treatment temperature in the performing of the second modification treatment is higher than a treatment temperature in the performing of the first modification treatment, and
the treatment temperature in the performing of the first modification treatment is higher than a treatment temperature in the forming of the thin film on the substrate.

6. The method of claim 1, wherein the forming of the thin film on the substrate comprises:
forming a certain element-containing layer by supplying the source gas into the process container;
changing the certain element-containing layer to an oxide layer by supplying an oxygen ($O_2$) gas and a hydrogen ($H_2$) gas into the heated process container under the pressure less than the atmospheric pressure; and
forming an oxide film on the substrate by alternately performing a certain number of times the forming of the certain element-containing layer and the changing of the certain element-containing layer to the oxide layer.

7. The method of claim 1, wherein the performing of the first modification treatment comprises:
generating an oxidative species by reacting the oxygen ($O_2$) gas with the hydrogen ($H_2$) gas, in the heated process container under the pressure less than the atmospheric pressure; and
performing the first modification treatment to the adsorption layer of the residual source gas by using the oxidative species, and
wherein the performing of the second modification treatment comprises:
generating an oxidative species by reacting the oxygen ($O_2$) gas with the hydrogen ($H_2$) gas, in the heated process container under the pressure less than the atmospheric pressure; and
performing the second modification treatment to the byproduct by using the oxidative species.

8. The method of claim 6, wherein the changing of the certain element-containing layer to the oxide layer comprises:
generating an oxidative species by reacting the oxygen ($O_2$) gas with the hydrogen ($H_2$) gas, in the heated process container under the pressure less than the atmospheric pressure; and
changing the certain element-containing layer to the oxidative layer by using the oxidative species.

9. The method of claim 1, wherein,
the certain element comprises a silicon element or a metal element, and
the halogen element comprises a chlorine element or a fluorine element.

10. A method of processing a substrate, comprising:
carrying a substrate into a process container;
forming a thin film on the substrate by supplying a source gas into the process container accommodating the substrate, the source gas containing a certain element and a halogen element;
performing a first modification treatment to an adsorption layer of a residual source gas adhered to an inside of the process container by simultaneously supplying a combination of gases consisting of oxygen ($O_2$) gas and hydrogen ($H_2$) gas into the heated process container under a pressure less than an atmospheric pressure, in the state of accommodating the thin film-formed substrate in the process container;
carrying the thin film-formed substrate out of the process container; and
performing a second modification treatment to the modified adsorption layer adhered to the inside of the process container, which is formed by performing the first modification treatment to the adsorption layer of the residual source gas and being oxidized by a water in an atmosphere penetrated into the process container in the carrying of the thin film-formed substrate out of the process container, the second modification treatment consisting of simultaneously supplying a combination of gases consisting of oxygen ($O_2$) gas and hydrogen ($H_2$) gas into the heated process container under a pressure less than the atmospheric pressure, in the state of not accommodating the substrate in the process container, the adsorption layer being a first adsorption layer of the residual source gas, to which the first modification treatment has been performed, or a second adsorption layer of the residual source gas, which is not modified by the first modification treatment,
wherein the simultaneous supply of the combination of gases consisting of the oxygen ($O_2$) gas and the hydrogen ($H_2$) gas into the process container for the first and second modifications includes activating the oxygen ($O_2$) gas and the hydrogen ($H_2$) gas by heat and generating oxidative species not containing water ($H_2O$) but containing an atomic oxygen based on the activation of the oxygen ($O_2$) gas and the hydrogen ($H_2$) gas.

11. The method of claim 1, wherein the process container comprises a reaction tube and a manifold, and the adsorption layer of the residual source gas and the byproduct are adhered to an inside of the manifold.

12. The method of claim 1, wherein the process container comprises a reaction tube formed of quartz or silicon carbide and a manifold formed of metal, and the adsorption layer of the residual source gas and the byproduct are adhered to an inside of the manifold.

13. A method of manufacturing a semiconductor device, comprising:
carrying a substrate into a process container;
forming a thin film on the substrate by supplying a source gas into the process container accommodating the substrate, the source gas containing a certain element and a halogen element;

performing a first modification treatment to an adsorption layer of a residual source gas adhered to an inside of the process container by using an oxidative species comprising atomic oxygen generated by simultaneously supplying a combination of gases consisting of oxygen ($O_2$) gas and hydrogen ($H_2$) gas into the heated process container under a pressure less than an atmospheric pressure and reacting the oxygen ($O_2$) gas with the hydrogen ($H_2$) gas in the process container, in the state of accommodating the thin film-formed substrate in the process container;

carrying the thin film-formed substrate out of the process container; and performing a second modification treatment to the modified adsorption layer adhered to the inside of the process container, which is formed by performing the first modification treatment to the adsorption layer of the residual source gas and being oxidized by a water in an atmosphere penetrated into the process container in the carrying of the thin film-formed substrate out of the process container, by using an oxidative species comprising atomic oxygen generated by the second modification treatment consisting of simultaneously supplying a combination of gases consisting of oxygen ($O_2$) gas and hydrogen ($H_2$) gas into the heated process container under a pressure less than the atmospheric pressure and reacting the oxygen ($O_2$) gas with the hydrogen ($H_2$) gas in the process container, in the state of not accommodating the substrate in the process container, the adsorption layer being a first adsorption layer of the residual source gas, to which the first modification treatment has been performed, or a second adsorption layer of the residual source gas, which is not modified by the first modification treatment, wherein the simultaneous supply of the combination of gases consisting of the oxygen ($O_2$) gas and the hydrogen ($H_2$) gas into the process container for the first and second modifications includes activating the oxygen ($O_2$) gas and the hydrogen ($H_2$) gas by heat and generating oxidative species not containing water ($H_2O$) but containing an atomic oxygen based on the activation of the oxygen ($O_2$) gas and the hydrogen ($H_2$) gas.

\* \* \* \* \*